United States Patent
Watanabe et al.

(10) Patent No.: US 10,559,653 B2
(45) Date of Patent: Feb. 11, 2020

(54) SILICON CARBIDE SEMICONDUCTOR DEVICE AND METHOD FOR MANUFACTURING SILICON CARBIDE SEMICONDUCTOR DEVICE

(71) Applicant: Mitsubishi Electric Corporation, Chiyoda-ku (JP)

(72) Inventors: Tomokatsu Watanabe, Tokyo (JP); Shiro Hino, Tokyo (JP); Yusuke Yamashiro, Tokyo (JP); Toshiaki Iwamatsu, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/307,184

(22) PCT Filed: May 23, 2017

(86) PCT No.: PCT/JP2017/019209
§ 371 (c)(1),
(2) Date: Dec. 5, 2018

(87) PCT Pub. No.: WO2018/016171
PCT Pub. Date: Jan. 25, 2018

(65) Prior Publication Data
US 2019/0131388 A1 May 2, 2019

(30) Foreign Application Priority Data
Jul. 21, 2016 (JP) .................. 2016-143086

(51) Int. Cl.
*H01L 31/0312* (2006.01)
*H01L 29/06* (2006.01)
(Continued)

(52) U.S. Cl.
CPC ........ *H01L 29/063* (2013.01); *H01L 21/0262* (2013.01); *H01L 21/02236* (2013.01);
(Continued)

(58) Field of Classification Search
CPC combination set(s) only.
See application file for complete search history.

(56) References Cited

U.S. PATENT DOCUMENTS

| | | |
|---|---|---|
| 2010/0200866 A1 | 8/2010 | Kitou et al. |
| 2011/0057202 A1 | 3/2011 | Kono et al. |

(Continued)

FOREIGN PATENT DOCUMENTS

| | | |
|---|---|---|
| DE | 10 2010 001 720 A1 | 8/2010 |
| DE | 10 2011 004 247 A1 | 8/2011 |

(Continued)

OTHER PUBLICATIONS

Office Action dated Feb. 21, 2019 in German Patent Application No. 11 2017 003 660.7, 9 pages (with English translation).

(Continued)

*Primary Examiner* — Robert G Bachner
(74) *Attorney, Agent, or Firm* — Oblon, McClelland, Maier & Neustadt, L.L.P.

(57) ABSTRACT

The technique disclosed in the Description relates to a technique preventing dielectric breakdown while a silicon carbide semiconductor device is OFF, without degrading process throughput or yield. The silicon carbide semiconductor device relating to the technique disclosed in the Description includes a drift layer of a first conductivity type, a threading dislocation provided to penetrate the drift layer, and an electric-field reduction region of a second conductivity type disposed in a position in the surface layer of the (Continued)

drift layer, the position corresponding to the threading dislocation. The electric-field reduction region is an epitaxial layer.

13 Claims, 18 Drawing Sheets

(51) Int. Cl.
| | |
|---|---|
| H01L 29/872 | (2006.01) |
| H01L 21/20 | (2006.01) |
| H01L 21/265 | (2006.01) |
| H01L 29/78 | (2006.01) |
| H01L 29/12 | (2006.01) |
| H01L 21/02 | (2006.01) |
| H01L 21/04 | (2006.01) |
| H01L 29/10 | (2006.01) |
| H01L 29/16 | (2006.01) |
| H01L 29/66 | (2006.01) |
| H01L 29/739 | (2006.01) |

(52) U.S. Cl.
CPC .. *H01L 21/02255* (2013.01); *H01L 21/02529* (2013.01); *H01L 21/02579* (2013.01); *H01L 21/049* (2013.01); *H01L 21/0465* (2013.01); *H01L 21/0475* (2013.01); *H01L 21/0485* (2013.01); *H01L 21/20* (2013.01); *H01L 21/265* (2013.01); *H01L 29/1095* (2013.01); *H01L 29/12* (2013.01); *H01L 29/1608* (2013.01); *H01L 29/66068* (2013.01); *H01L 29/78* (2013.01); *H01L 29/7802* (2013.01); *H01L 29/872* (2013.01); H01L 29/7395 (2013.01)

(56) References Cited

U.S. PATENT DOCUMENTS

| | | |
|---|---|---|
| 2011/0203513 A1 | 8/2011 | Watanabe et al. |
| 2013/0009256 A1 | 1/2013 | Okumura et al. |
| 2015/0380485 A1 | 12/2015 | Wada et al. |

FOREIGN PATENT DOCUMENTS

| | | |
|---|---|---|
| DE | 11 2014 001 560 T5 | 11/2015 |
| JP | 2011-60930 A | 3/2011 |
| JP | 2011-211020 A | 10/2011 |
| JP | 2013-254826 A | 12/2013 |
| JP | 2015-216348 A | 12/2015 |

OTHER PUBLICATIONS

International Search Report dated Aug. 15, 2017, in PCT/JP2017/019209, filed May 23, 2017.

F I G. 7
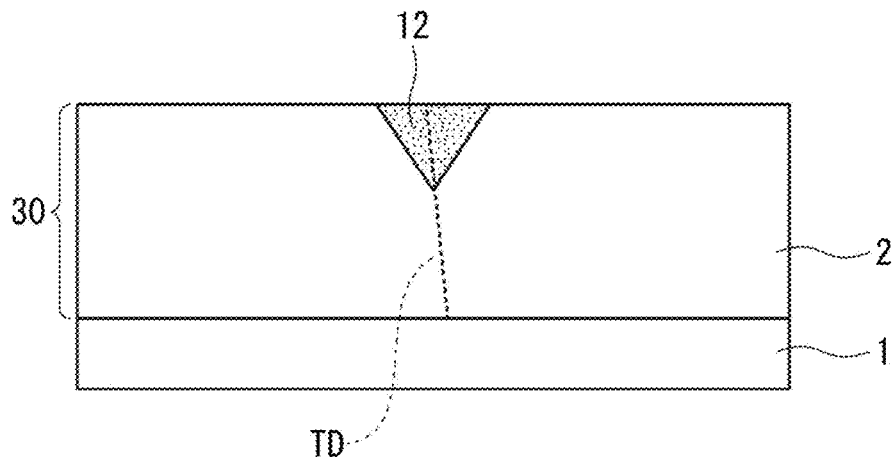
F I G. 8
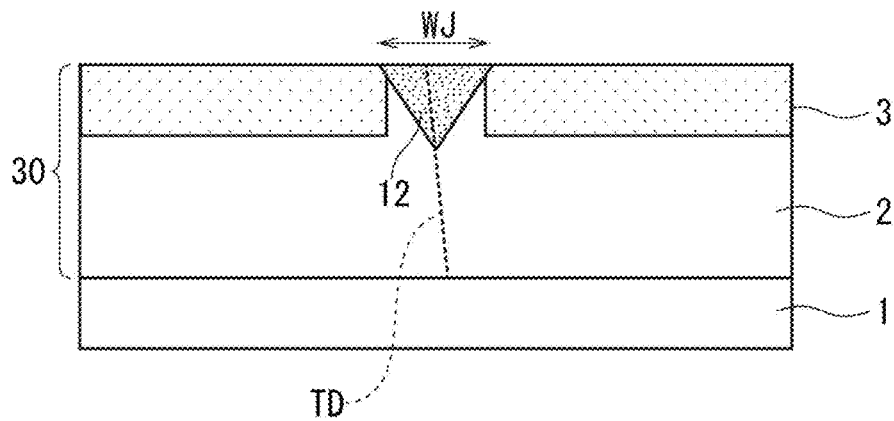
F I G. 9
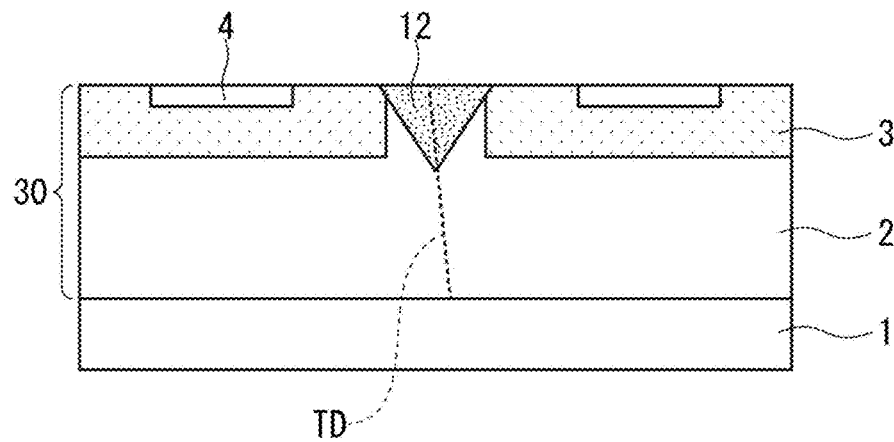

F I G. 2 1
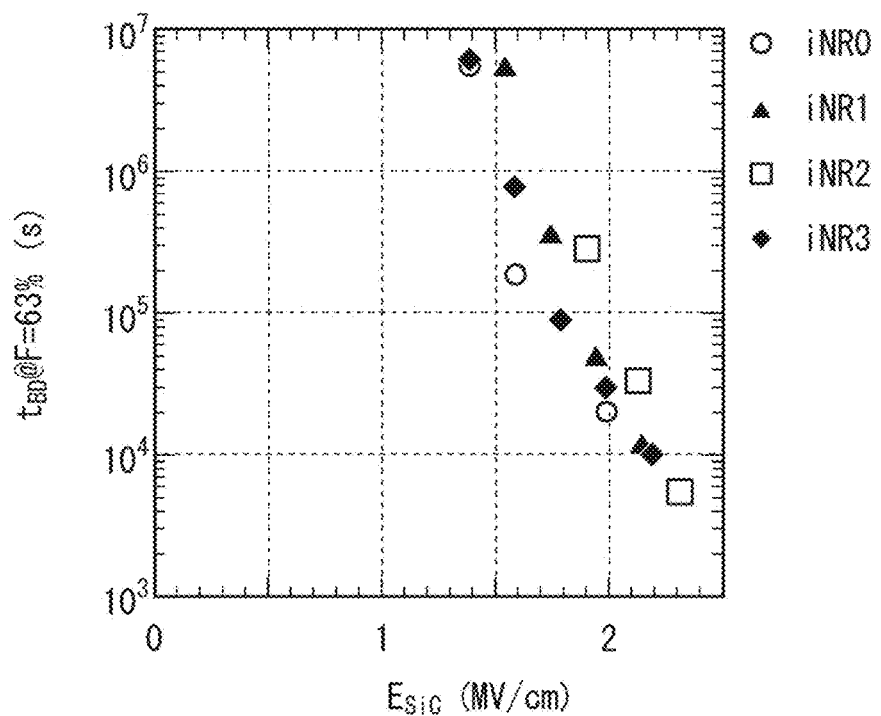
F I G. 2 2
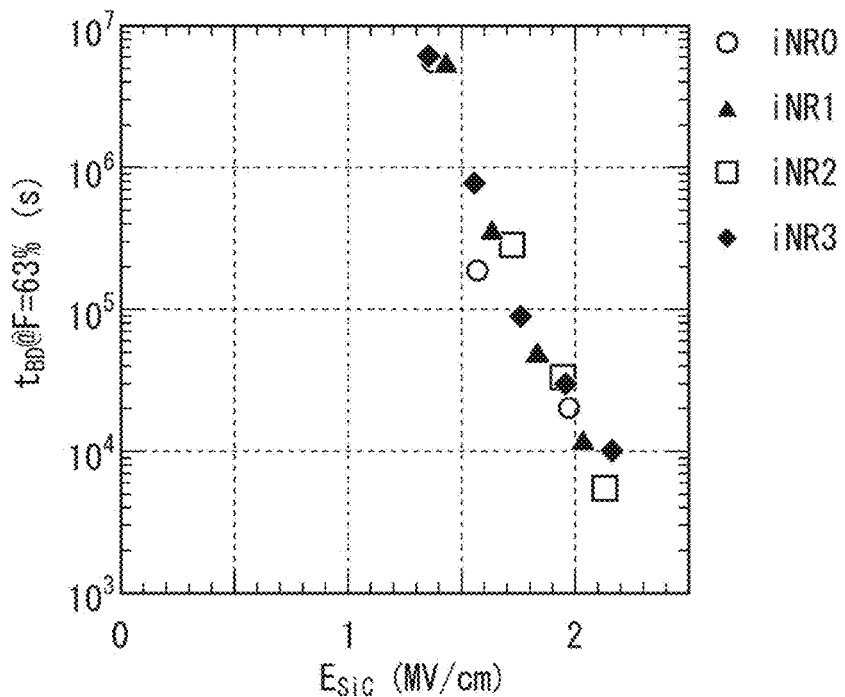

SILICON CARBIDE SEMICONDUCTOR DEVICE AND METHOD FOR MANUFACTURING SILICON CARBIDE SEMICONDUCTOR DEVICE

TECHNICAL FIELD

The technique disclosed in the Description relates to a silicon carbide semiconductor device and a method for manufacturing the silicon carbide semiconductor device.

BACKGROUND ART

Improvements in the reliability of a silicon carbide semiconductor device have been actively studied in the use of such a semiconductor device, i.e., a semiconductor device including a silicon carbide (SiC) layer, as a power semiconductor device.

Since SiC per se has high strength against dielectric breakdown, the silicon carbide semiconductor device tends to involve dielectric breakdown not in the SiC layer, but in an insulating film disposed on the upper surface of the SiC layer. Hence, preventing the deterioration of the insulating film is important to enhance the reliability of the silicon carbide semiconductor device.

In particular, a silicon carbide semiconductor device, such as a metal-oxide-semiconductor field-effect transistor (MOSFET) and an insulated gate bipolar transistor (IGBT), that has an insulating gate structure, desirably prevents dielectric breakdown in a gate insulating film.

A SiC-MOSFET or an IGBT, a practical power semiconductor device, typically includes p-type well regions adjacent to each other via a drift layer of n-type. The drift layer has a region sandwiched between the well regions. This region is called a junction field effect transistor (JFET).

A high electric field is applied to a gate insulating film immediately on the JFET region while the MOSFET or the IGBT is OFF. Thus, the gate insulating film tends to involve dielectric breakdown particularly on the JFET region. Accordingly, preventing the dielectric breakdown is under study.

In one example, Japanese Patent Application Laid-Open No. 2011-060930 (Patent Document 1) describes a p⁻ region disposed between p well regions facing each other, via an n⁻ layer. That is, the p⁻ region is formed under a gate insulating film in a JFET region.

Hence, depletion in the upper part of the JFET region is promoted while a MOSFET is OFF. This lowers the electric field strength applied to the gate insulating film in the upper part of the JFET region when compared to a structure provided with no p region. Consequently, the gate insulating film is prevented from breakdown when a high voltage is applied across an element, thereby improving the reliability of the gate insulating film.

In another example, Japanese Patent Application Laid-Open No. 2011-211020 (Patent Document 2) describes p body regions adjacent to each other that are provided with p⁻ regions serving as electric-field reduction layers.

In another example, Japanese Patent Application Laid-Open No. 2015-216348 (Patent Document 3) describes that a threading dislocation in a JFET region of a SiC layer particularly tends to cause dielectric breakdown. Accordingly, an electric-field reduction region of p-type conductivity for electric field reduction is disposed in only a region having a threading dislocation in a surface of a drift layer. This positively reduces the electric field concentration at a portion where breakdown is most likely to occur, thus improving the reliability.

PRIOR ART DOCUMENTS

Patent Documents

Patent Document 1: Japanese Patent Application Laid-Open No. 2011-060930
Patent Document 2: Japanese Patent Application Laid-Open No. 2011-211020
Patent Document 3: Japanese Patent Application Laid-Open No. 2015-216348

SUMMARY

Problem to be Solved by the Invention

The techniques disclosed in Patent Documents 1 and 2 are silent about the thickness of the electric-field reduction region of p-type disposed in part of the JFET region. A electric-field reduction region of p-type having a thickness of 0.1 µm or more and 0.4 µm or less would hinder carrier-electron's travel while the MOSFET is ON, thus considerably increasing an ON-resistance.

In the technique disclosed in Patent Document 3, the electric-field reduction region of p-type is formed through Al-ion implantation. Here, known in ion implantation is establishing a tail profile on the deeper side of the ion to be implanted; moreover, the deeper implantation using high energy is performed, the more noticeable the effect is seen.

Provided that Al ions with a concentration peak at a depth of 0.1 µm or more and 0.4 µm or less are implanted, its tail profile extends to a depth of the order of 1 µm or more and 2 µm or less.

All the Al-ion implantation layers in a region having no threading dislocation need to be removed. Hence, the SiC layer having a thickness of 1 µm or more and 2 µm or less needs to be removed through etching-back. As such, completing this self-alignment process requires a pit in a region with a threading dislocation to have a depth of the order of 2 µm or more so that the Al-ion implantation layers are not removed.

The process of setting the pit in the region with the threading dislocation to have the above range of depth is extremely inefficient and builds a hurdle to maintain high in-plane homogeneity. This considerably degrades process throughput or yield.

This possible degradation is more serious in fabricating a SiC-MOSFET or IGBT having a higher breakdown voltage. For one thing, the tail profile affects a deeper region because further breakdown-voltage enhancement requires a reduction in doping concentration in the drift layer.

Accordingly, the SiC layer needs to be removed to a further large degree through etching-back; in addition, the pit in the region with the threading dislocation needs to be further deep. That is, a manufacturing method using Al-ion implantation is extremely inefficient particularly for a SiC-MOSFET or IGBT having a super-high breakdown voltage, thus considerably degrading the process throughput or the yield.

To solve the above problem, the technique disclosed in the Description relates to a technique preventing dielectric breakdown while a silicon carbide semiconductor device is OFF, without degrading process throughput or yield.

Means to Solve the Problem

A first aspect of the technique disclosed in the Description includes a drift layer of a first conductivity type, a threading dislocation provided to penetrate the drift layer, and an electric-field reduction region of a second conductivity type disposed in a position in the surface layer of the drift layer, the position corresponding to the threading dislocation. The electric-field reduction region is an epitaxial layer.

A second aspect of the technique disposed in the Description includes the following: preparing a silicon carbide layer including a threading dislocation provided to extend from the lower surface of the silicon carbide layer to the upper surface of the silicon carbide layer; forming a pit in a position in the upper surface of the silicon carbide layer, the position corresponding to the threading dislocation; after forming the pit, epitaxially growing a silicon carbide epitaxial layer of a second conductivity type on the upper surface of the silicon carbide layer; and partly removing the silicon carbide epitaxial layer while leaving a portion buried in the pit unremoved, to form an electric-field reduction region.

Effects of the Invention

The first aspect of the technique disclosed in the Description includes the drift layer of the first conductivity type, the threading dislocation provided to penetrate the drift layer, and the electric-field reduction region of the second conductivity type disposed in the position in the surface layer of the drift layer, the position corresponding to the threading dislocation. The electric-field reduction region is the epitaxial layer. Such a configuration, in which the electric-field reduction region of the second conductivity type is the epitaxial layer, fails to establish the tail profile of a dopant of the second conductivity type. This improves the reliability of the silicon carbide semiconductor device during its OFF state without degrading the process throughput or yield.

The second aspect of the technique disposed in the Description includes the following: preparing the silicon carbide layer including the threading dislocation provided to extend from the lower surface of the silicon carbide layer to the upper surface of the silicon carbide layer; forming the pit in the position in the upper surface of the silicon carbide layer, the position corresponding to the threading dislocation; after forming the pit, epitaxially growing the silicon carbide epitaxial layer of the second conductivity type on the upper surface of the silicon carbide layer; and partly removing the silicon carbide epitaxial layer while leaving the portion buried in the pit unremoved, to form the electric-field reduction region. Such a configuration, in which the electric-field reduction region of the second conductivity type is formed through epitaxial growth, fails to establish the tail profile of a dopant of the second conductivity type. This improves the reliability of the silicon carbide semiconductor device during its OFF state without degrading the process throughput or yield.

These and other objects, features, aspects and advantages of the Description will become more apparent from the following detailed description of the Description when taken in conjunction with the accompanying drawings.

BRIEF DESCRIPTION OF DRAWINGS

FIG. 1 is a partial cross-sectional view of the configuration of a unit cell in a MOSFET. In particular, FIG. 1 illustrates the configuration of a region having no threading dislocation.

FIG. 2 is a partial cross-sectional view of the configuration of the unit cell in the MOSFET. In particular, FIG. 2 illustrates the configuration of a region having a threading dislocation.

FIG. 7 is a partial cross-sectional view used to describe the method for manufacturing the MOSFET according to the embodiment.

FIG. 8 is a partial cross-sectional view used to describe the method for manufacturing the MOSFET according to the embodiment.

FIG. 9 is a partial cross-sectional view used to describe the method for manufacturing the MOSFET according to the embodiment.

FIG. 21 is a graph illustrating the $E_{SiC}$ dependence in the lifetime $t_{BD}$ in F=63%.

FIG. 22 is a graph illustrating the $E_{SiC}$ dependence in the lifetime $t_{BD}$ in F=63%.

DESCRIPTION OF EMBODIMENT(S)

An embodiment will be described with reference to the accompanying drawings.

The drawings are illustrative, and thus include the omission or simplification of configurations as appropriate for the sake of description. Further, the sizes of the configurations illustrated in the different drawings, and the mutual positional relationships between the configurations illustrated in the different drawings are not necessarily accurate, and can be thus changed as appropriate.

Like components are denoted by the same signs, and their names and functions are similar to one another. The detailed description of like components can be thus omitted to avoid redundancy.

Throughout the following description, any terms, such as "top", "under", "side", "bottom", "front", and "back", that indicate specific positions and specific directions, are used for facilitating the understanding of the embodiments. These terms thus have nothing to do with actual directions when the embodiment is implemented.

Throughout the following description, ordinal numbers, such as "first" and "second", are used for facilitating the understanding of the embodiment. The order indicated by these ordinal numbers is thus not restrictive.

<Embodiment>

The following describes a silicon carbide semiconductor device and a method for manufacturing the silicon carbide semiconductor device, according to an embodiment. In the following description, a first conductivity is an n-type; and a second conductivity, a p-type.

<Configuration of Silicon Carbide Semiconductor Device>

Figure 1:
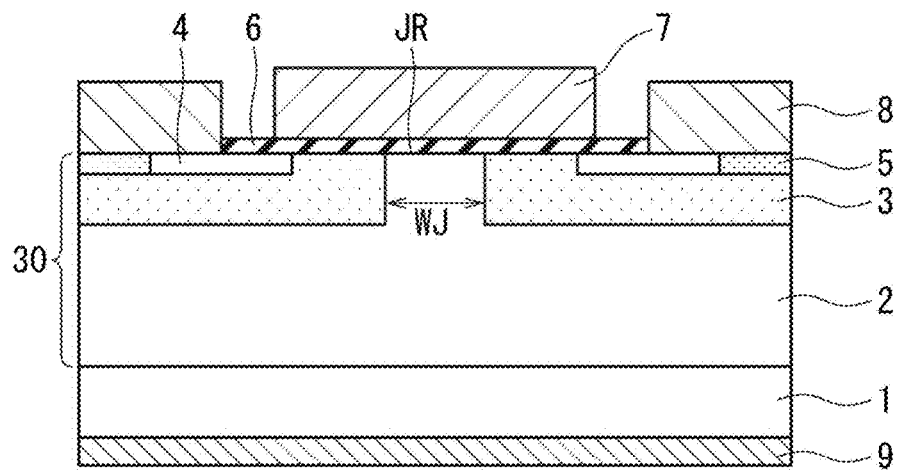
FIG. 1 is a partial cross-sectional view of a silicon carbide semiconductor device according to an embodiment. To be specific.
Figure 2:
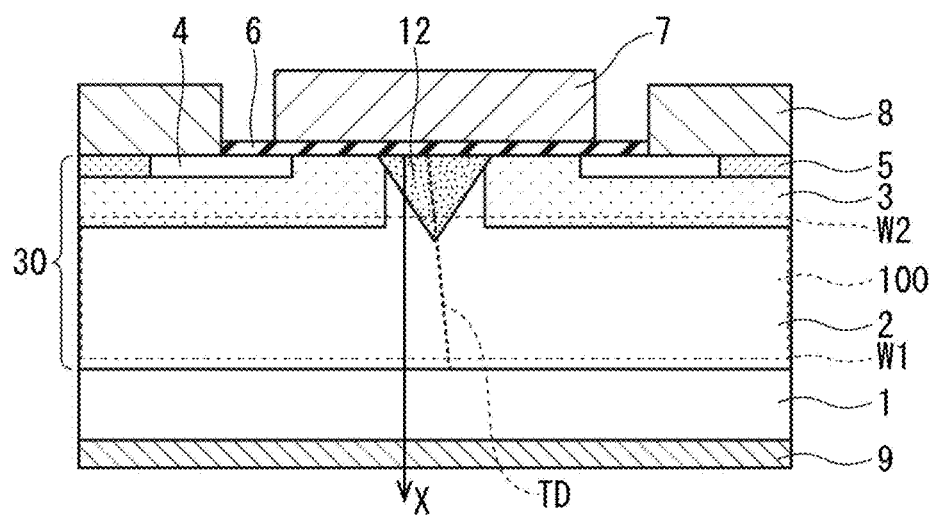
FIG. 2 is a partial cross-sectional view of the silicon carbide semiconductor device according to the embodiment. To be specific.

FIGS. 1 and 2 are partial cross-sectional views of the silicon carbide semiconductor device according to the embodiment. To be specific, FIGS. 1 and 2 are partial cross-sectional views of the configuration of a unit cell in a MOSFET. In particular, FIG. 1 illustrates the configuration of a region having no threading dislocation TD. Moreover, FIG. 2 illustrates the configuration of a region having a threading dislocation TD.

As illustrated in FIGS. 1 and 2, the MOSFET includes the following: a SiC substrate 1, which is a silicon carbide substrate; a SiC layer 30 disposed on the upper surface of the SiC substrate 1; a gate insulating film 6 disposed on the upper surface of the SiC layer 30; a gate electrode 7 disposed on the upper surface of the gate insulating film 6; a source electrode 8 disposed on the upper surface of the SiC layer 30, the upper surface having no insulating film 6; and a drain electrode 9 disposed on the lower surface of the SiC substrate 1.

Here, as illustrated in FIG. 2, when a JFET region JR in the unit cell contains the threading dislocation TD, an electric-field reduction region 12 on an upper surface S2 is disposed in the surface layer of a drift layer 2, i.e., the surface layer of the JFET region JR so as to include the upper end of the threading dislocation TD.

The SiC substrate 1 is a SiC semiconductor substrate of n-type conductivity (a first conductivity type). The SiC substrate 1 has an n-type-impurity concentration higher than the impurity concentration of the drift layer 2, which will be described later on. The SiC substrate 1 thus has a lower resistivity than the drift layer 2.

The SiC substrate 1 has a single-crystal structure. The crystal structure of the SiC substrate 1 is hexagonal, and is preferably a polytype 4H. The SiC substrate 1 has a surface, i.e., the upper surface of the SiC substrate 1 in FIGS. 1 and 2, whose plane orientation is a (0001) or (000-1) plane.

The SiC layer 30 is disposed on the upper surface of the SiC substrate 1. The SiC layer 30 has a lower surface S1 in contact with the SiC substrate 1, and the upper surface S2. The lower surface S1 is also referred to as a first surface. The upper surface S2 is also referred to a second surface opposite the first surface.

The SiC layer 30 includes the following: the drift layer 2 of n-type conductivity; a plurality of well regions 3 of p-type conductivity (a second conductivity type different from the first conductivity) disposed in the surface layer of the drift layer 2; a plurality of n-type source regions 4 disposed in the surface layers of the well regions 3; a plurality of p-type contact regions 5 disposed in the surface layers of the well regions 3; and the electric-field reduction region 12 of p-type conductivity disposed in the surface layer of the drift layer 2 so as to include the upper end of the threading dislocation TD. The SiC layer 30 has a thickness of, for instance, 1 μm or more and 100 μm or less.

The drift layer 2 partly constitutes the upper surface S2. The drift layer 2 includes the JFET region JR sandwiched between the well regions 3 adjacent to each other. The drift layer 2 has a maximum thickness corresponding to the thickness of the SiC layer 30. Its thickness is for instance, 1 μm or more and 100 μm or less.

The well regions 3 are located away from the lower surface S1 and partly constitute the upper surface S2. The well regions 3 in the upper surface S2 are each directly in contact with the gate insulating film 6 between the source region 4 and the JFET region JR.

The JFET region JR has a width, WJ, along a direction where the well regions 3 are adjacent to each other in the upper surface S2, i.e., along the lateral direction of FIGS. 1 and 2.

The source regions 4 are spaced from the JFET region JR via the well regions 3.

The contact regions 5 are in contact with the source regions 4 in the upper surface S2. The contact regions 5 extend from the upper surface S2 to the inside of the SiC layer 30 to reach the inside of the well regions 3. That is, the contact regions 5 are disposed at a shallower depth than the well regions 3.

The gate insulating film 6 is disposed on the upper surface S2 of the SiC layer 30. The gate insulating film 6 has an opening from which part of the source regions 4 and the contact regions 5 are exposed. The gate insulating film 6 has a portion covering the drift layer 2, i.e., a portion covering the JFET region JR in FIGS. 1 and 2.

The gate electrode 7 is disposed on the gate insulating film 6 including the position where the threading dislocation TD is located. As illustrated in FIGS. 1 and 2, the gate electrode 7 faces a portion of each well region 3, the portion being between the JFET region JR and the source region 4 via the gate insulating film 6, and faces the JFET region JR via the gate insulating film 6.

The source electrode 8 is in contact with part of the source regions 4 and the contact regions 5, on the upper surface S2 of the SiC layer 30. The source electrode 8 is an ohmic electrode disposed on the upper surface S2 of the SiC layer 30.

The drain electrode 9 is in contact with the lower surface of the SiC substrate 1. In other words, the drain electrode 9 is disposed on the lower surface S1 of the SiC layer 30 via the SiC substrate 1.

The drain electrode 9 is an ohmic electrode disposed on the lower surface of the SiC substrate 1. In other words, the drain electrode 9 is an electrode ohmically joined to the SiC layer 30 via the SiC substrate 1.

The electric-field reduction region 12 is at least partly buried in a location in the surface layer of the drift layer 2, the location having the threading dislocation TD.

<Method for Manufacturing Silicon Carbide Semiconductor Device>

The following describes a method for manufacturing the MOSFET according to the embodiment with reference to FIGS. 3 to 13. FIGS. 3 to 13 are partial cross-sectional views used to describe the method for manufacturing the MOSFET according to the embodiment. The field of view of the partial cross-sectional views in FIGS. 3 to 13 correspond to the field of view in FIGS. 1 and 2.

Figure 3:
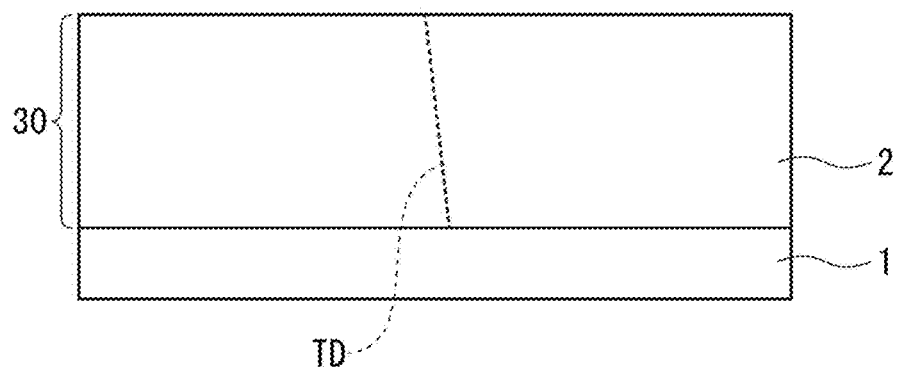
FIG. 3 is a partial cross-sectional view used to describe a method for manufacturing the MOSFET according to the embodiment.

Firstly, as illustrated in FIG. 3, prepared is the SiC substrate 1 having a surface that is a (0001) plane or a (000-1) plane.

Next, the SiC layer 30 is formed through epitaxial growth on the surface of the SiC substrate 1. This prepares the SiC layer 30 having the lower surface S1, facing the SiC substrate 1, and the upper surface S2.

The SiC layer 30 includes the drift layer 2, which at least partly constitutes the upper surface S2. In FIG. 3, the SiC layer 30 consists of the drift layer 2. In other words, this process step is preparing the drift layer 2.

Here, the threading dislocation TD is formed in the drift layer 2 so as to extend from the lower surface to upper surface of the drift layer 2.

The epitaxial growth can be performed through chemical vapor deposition (CVD). The SiC layer 30, particularly the drift layer 2 in FIG. 3, has an n-type-impurity concentration or donor concentration of, for instance, $1 \times 10^{15}$ cm$^{-3}$ or more and $1 \times 10^{18}$ cm$^{-3}$ or less.

Figure 4:
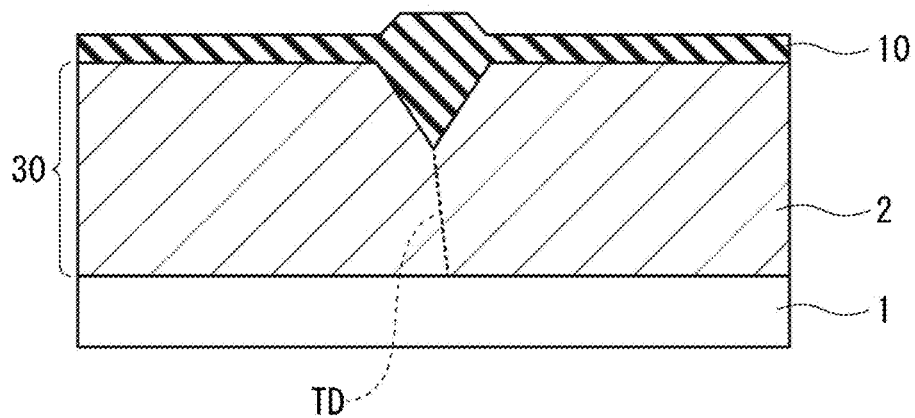
FIG. 4 is a partial cross-sectional view used to describe the method for manufacturing the MOSFET according to the embodiment.

Next, as illustrated in FIG. 4, a thermal oxide film 10 is formed on the upper surface S2 of the SiC layer 30. To be specific, the SiC substrate 1 undergoes thermal oxidation at a temperature ranging, for instance, from 700° C. or more to 1400° C. or less.

The thermal oxide film 10 has a thickness of, for instance, 10 nm or more and 1000 nm or less. At this stage, the thermal oxide film 10 is more deeply formed inside the drift layer 2 in a region near the threading dislocation TD than in the other region having no threading dislocation TD, because rapid oxidation occurs in the region near the threading dislocation TD. Hence, the thermal oxide film 10 has a greater thickness near a position having the threading dislocation TD than it has in a position having no threading dislocation TD.

The thermal oxide film 10 is formed by consuming the drift layer 2 of SiC. That is, the interface between the drift layer 2 and the thermal oxide film 10 as formed has a recess shape in the position having the threading dislocation TD.

Figure 5:
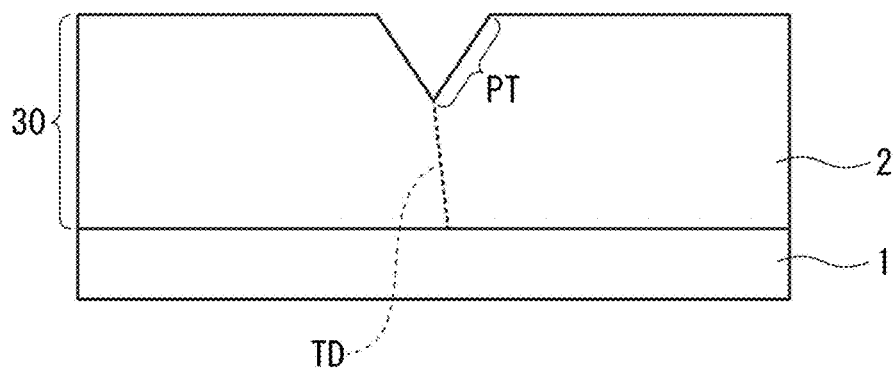
FIG. 5 is a partial cross-sectional view used to describe the method for manufacturing the MOSFET according to the embodiment.

Next, as illustrated in FIG. 5, the thermal oxide film 10 is removed through wet etching. This forms, in the upper surface S2 of the SiC layer 30, a pit PT resulting from the threading dislocation TD.

The wet etching can be performed using hydrofluoric acid. In cross-sectional view in FIG. 5, the pit PT preferably has a width of, for instance, 5.0 μm or less at the widest site, and more preferably has a width of, for instance, 0.1 μm or more and 2.0 μm or less at the widest site.

It is noted that forming the pit PT may include forming the drift layer 2, illustrated in FIG. 3, subsequently followed by annealing at high temperature within a hydrogen gas to dry-etch the upper surface S2 of the drift layer 2 at a depth of 10 nm or more and 1000 nm or less. At this stage, the drift layer 2 is etched in the region near the threading dislocation TD more rapidly than in the region having no threading dislocation TD. This similarly forms the pit PT resulting from the threading dislocation TD. The annealing at high temperature within the hydrogen gas is performed at a temperature ranging, for instance, from 1300° C. or more to 2000° C. or less. This annealing method eliminates the need for the step of forming the thermal oxide film 10, illustrated in FIG. 4, and the step of removing the thermal oxide film 10, illustrated in FIG. 5.

Figure 6:
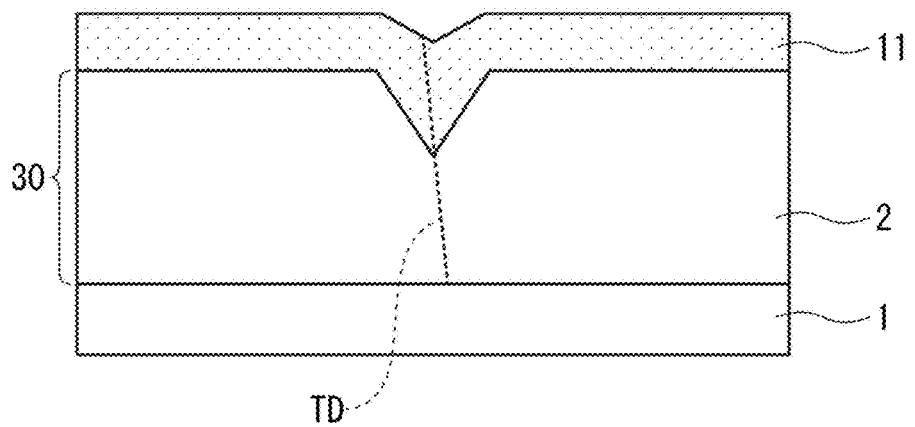
FIG. 6 is a partial cross-sectional view used to describe the method for manufacturing the MOSFET according to the embodiment.

Next, as illustrated in FIG. 6, the upper surface S2 of the SiC layer 30 undergoes epitaxial growth including an acceptor or conductive impurity, thereby forming a p-type SiC epitaxial layer 11. The p-type SiC epitaxial layer 11 includes a portion constituting the electric-field reduction region 12 in FIG. 2. Acceptor doping is performed through, for instance, CVD introducing an aluminum (Al)-containing gas.

The concentration of a p-type impurity to be doped, i.e., the concentration of the acceptor, ranges, for instance, from $1 \times 10^{15}$ cm$^{-3}$ or more to $1 \times 10^{20}$ cm$^{-3}$ or less. Further, the thickness of the p-type SiC epitaxial layer 11 is not more than the thickness of the drift layer 2 and is, for instance, 0.1 μm or more and 1.0 μm or less.

The epitaxial growth process is for the sake of burying the pit PT using the p-type epitaxial layer. Hence, lateral step-flow growth is preferably promoted as much as possible. Accordingly, a C/Si ratio, used as the flow ratio of a material gas in a CVD process and corresponding to the flow ratio of propane ($C_3H_8$) to mono-silane ($SiH_4$), is preferably set to have a range lower than a commonly used range of 1.5 or more and 2.5 or less. Nevertheless, a C/Si ratio of 0.5 or less flocculates excessive Si atoms to a substrate surface, thus easily forming an unfavorable defect called a Si droplet. To be specific, the C/Si ratio is preferably set to range from 0.5 or more to 1.5 or less in forming the p-type SiC epitaxial layer 11.

Next, as illustrated in FIG. 7, all the p-type SiC epitaxial layer 11 but the electric-field reduction region 12 undergoes etching, and at the same time, the pit PT undergoes flattening, through etching-back or polishing. Here, in the etching-back, a silicon oxide film can be deposited all over the upper surface S2 to form an etching mask, and further, the upper surface S2 can undergo dry etching via the etching mask.

Next, as illustrated in FIG. 8, the well regions 3 are formed that is adjacent to each other at an interval of the width WJ. Before the well regions 3 are formed, a resist mask (not shown) is formed on the upper surface S2.

Next, the upper surface S2 is doped with a p-type impurity or acceptor through ion implantation. Then, the resist mask is removed. This forms the well regions 3 in the surface layer of the drift layer 2.

Examples of the acceptor include aluminum, boron, and gallium. The concentration of the p-type impurity or acceptor to be doped is higher than the donor concentration of the drift layer 2, and ranges, for instance, from $1 \times 10^{15}$ cm$^{-3}$ or more to $1 \times 10^{19}$ cm$^{-3}$ or less. Further, the depth of the ion implantation is not more than the thickness of the drift layer 2, for instance, 0.5 m or more and 3 μm or less.

Next, as illustrated in FIG. 9, the source regions 4 are formed in the surface layers of the respective well regions 3. To be specific, a resist mask (not shown) is firstly formed on the upper surface S2. Subsequently, the upper surface S2 is doped with an n-type impurity (donor) through ion implantation. Then, the resist mask is removed. This forms the source regions 4 within the well regions 3. The source regions 4 are formed more shallowly than the well regions 3.

Examples of the donor include nitrogen, phosphorus and arsenic. The source regions 4 each have a donor concentration ranging, for instance, from $1 \times 10^{18}$ cm$^{-3}$ or more to $1 \times 10^{20}$ cm$^{-3}$ or less. Further, the depth of the ion implantation is less than the depth of the well region 3, and is for instance, 0.1 μm or more and 2 μm or less.

Figure 10:
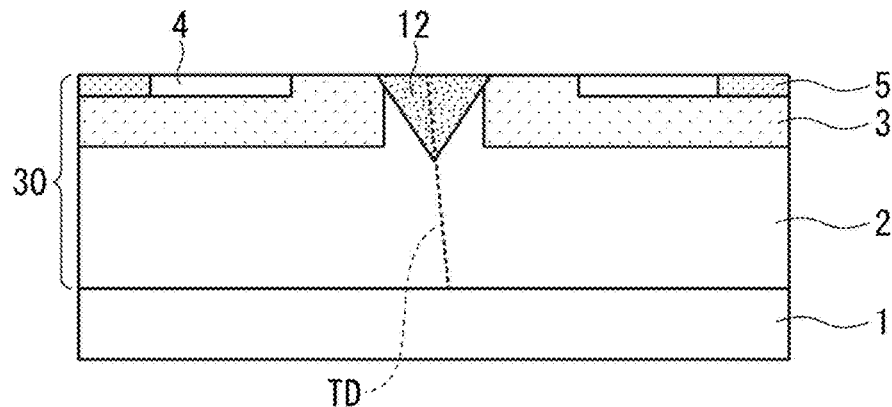
FIG. 10 is a partial cross-sectional view used to describe the method for manufacturing the MOSFET according to the embodiment.

Next, as illustrated in FIG. 10, the contact regions 5 are formed in the surface layers of the respective well regions 3. To be specific, a resist mask (not shown) is firstly formed on the upper surface S2. Subsequently, the upper surface S2 is doped with a p-type impurity or acceptor through ion implantation. Then, the resist mask is removed. This forms the contact regions 5 adjacent to the source regions 4, within the well regions 3.

Examples of the acceptor include aluminum, boron, and gallium. The concentration of the p-type impurity or acceptor to be doped ranges, for instance, from $1 \times 10^{19}$ cm$^{-3}$ or more to $1 \times 10^{21}$ cm$^{-3}$ or less. Further, the depth of the ion implantation is 0.1 μm or more and 2.1 μm or less. In addition, the depth of the ion implantation is deeper than that of the source region 4.

Next, the SiC substrate 1 on which the drift layer 2, which now includes the well regions 3, the source regions 4, and the contact regions 5, i.e., the SiC layer 30 is disposed undergoes annealing in a heat treatment apparatus at a temperature ranging from 1300° C. or more and 2100° C. or less within an atmosphere of inert gas, such as argon. This electrically activates the impurity, such as boron, aluminum or nitrogen, as doped through ion implantation.

Figure 11:
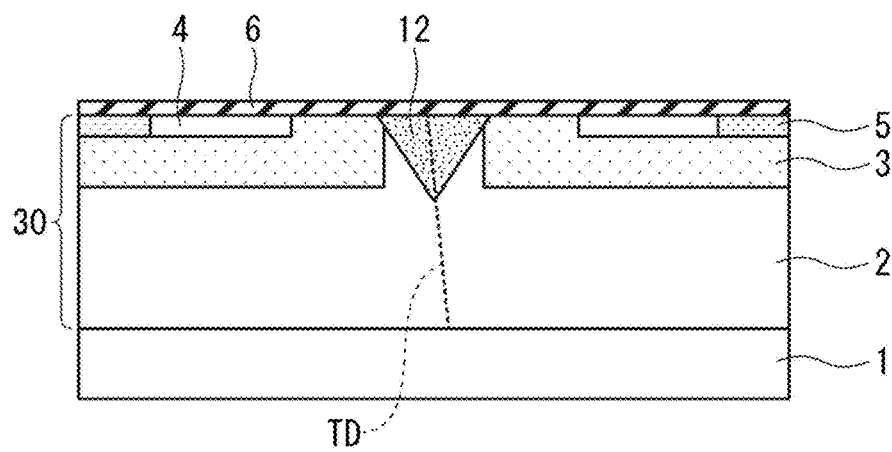
FIG. 11 is a partial cross-sectional view used to describe the method for manufacturing the MOSFET according to the embodiment.

Next, as illustrated in FIG. 11, the upper surface S2 undergoes thermal oxidation at a temperature ranging from 700° C. or more to 1400° C. or less, or undergoes a stacking process through deposition, such as CVD. This forms the gate insulating film 6 on the upper surface S2 of the SiC layer 30. The gate insulating film 6 has a thickness ranging, for instance, from 10 nm or more to 200 nm or less.

Figure 12:
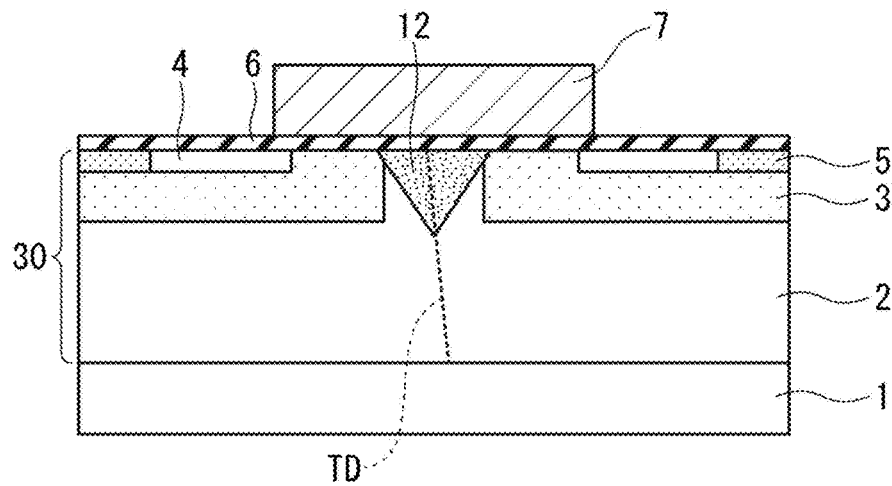
FIG. 12 is a partial cross-sectional view used to describe the method for manufacturing the MOSFET according to the embodiment.

Next, as illustrated in FIG. 12, the gate electrode 7 is formed on the upper surface of the gate insulating film 6. The gate electrode 7 is formed in such a manner that, in cross-sectional view, one end (the left end in FIG. 12) of the gate electrode 7 faces one (the source region 4 on the left side of FIG. 12) of the adjacent source regions 4 with the gate insulating film 6 interposed between the gate electrode 7 and the source region 4. That is, the left end of the gate electrode 7 in FIG. 12 overlaps the source region 4 on the left side of FIG. 12 in plan view.

Likewise, the gate electrode 7 is formed in such a manner that, in cross-sectional view, the other end (the right end in FIG. 12) faces the other source region 4 (the source region 4 on the right side of FIG. 12) with the gate insulating film 6 interposed between the gate electrode 7 and the source region 4. That is, the right end of the gate electrode 7 in FIG. 12 overlaps the source region 4 on the right side of FIG. 12 in plan view.

The gate electrode 7 can be formed by depositing a poly-crystal silicon film through CVD and patterning the poly-crystal silicon film through photolithography and etching.

Figure 13:
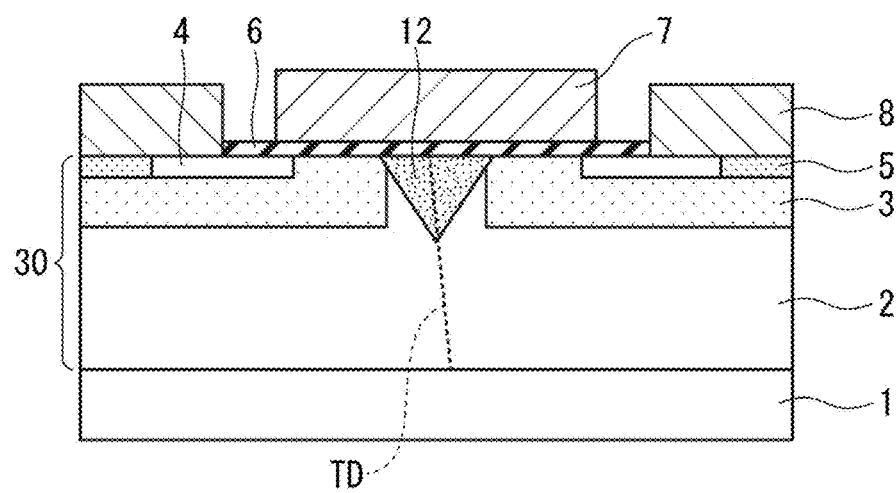
FIG. 13 is a partial cross-sectional view used to describe the method for manufacturing the MOSFET according to the embodiment.

Next, as illustrated in FIG. 13, the source electrode 8 is formed. To be specific, removed is a portion of the gate insulating film 6, the portion extending from part of the surfaces of the source regions 4 to the contact regions 5, with the portion where the gate electrode 7 is formed and its surroundings unremoved.

Then, the source electrode 8 is formed in a portion on the upper surface S2 of the SiC layer 30 as exposed by removing the gate insulating film 6, the portion extending from part of the surfaces of the source regions 4 to part of the surfaces of the contact regions 5.

The source electrode 8 is made of, for instance, nickel, titanium, aluminum, molybdenum, chrome, platinum, tungsten, tantalum, niobium, silicon, or titanium carbide, or made of a nitride containing these materials or an alloy containing these materials.

Next, as illustrated in FIGS. 1 and 2, the drain electrode 9 is formed on the lower surface of the SiC substrate 1. The drain electrode 9 is made of a material similar to that of the source electrode 8.

Next, annealing is performed to form an alloy of the source electrode 8 and silicon carbide in contact with the source electrode 8. Likewise, annealing is performed to form an alloy of the drain electrode 9 and silicon carbide in contact with the drain electrode 9.

These annealing processes can use the following non-limiting condition: a temperature of 950° C. or more and 1000° C. or less, a process duration of 20 seconds or more and 60 seconds or less, and a rate of temperature rise of 10° C. per second or more and 25° C. per second or less.

The MOSFET illustrated in FIGS. 1 and 2 are manufactured through the aforementioned manufacturing method.

<Operation of Silicon Carbide Semiconductor Device>

The following describes the operation of the MOSFET according to the embodiment with a positive voltage applied to the drain electrode 9.

For instance, as illustrated in FIG. 2, a reverse bias at a pn junction extends a depletion layer 100 all over an element region while a channel is OFF. Here, as illustrated in FIG. 2, let the distance between a coordinate x and the end on the lower surface side of the drift layer 2 in the depletion layer 100 be $W_1$, and let the distance between the coordinate x and the end on the upper surface side of the drift layer 2 in the depletion layer 100 be $W_2$. Herein, the upper surface of the drift layer 2 is the origin point of the coordinate x. The depletion layer 100, which extends in such a manner as described above, electrically insulates the source electrode 8 from the drain electrode 9.

At this time, a voltage that is almost the same as the reverse bias is applied also between the gate electrode 7 and the drain electrode 9. The gate insulating film 6, which is in contact with the drift layer 2 in the JFET region, also receives a high electric field on the JFET region JR.

That is, while the MOSFET is OFF, the JFET region JR includes an n-type MOS structure in depletion form, and the gate insulating film 6 to which a reverse electric field is applied.

<Preliminary Test>

The inventors evaluated time-dependent dielectric breakdown (TDDB) characteristics in depletion mode where a conventional n-type MOS structure is reverse-biased, to focus on the need for improving the reliability of the gate insulating film 6 during the OFF state. The following details this finding.

Figure 14:
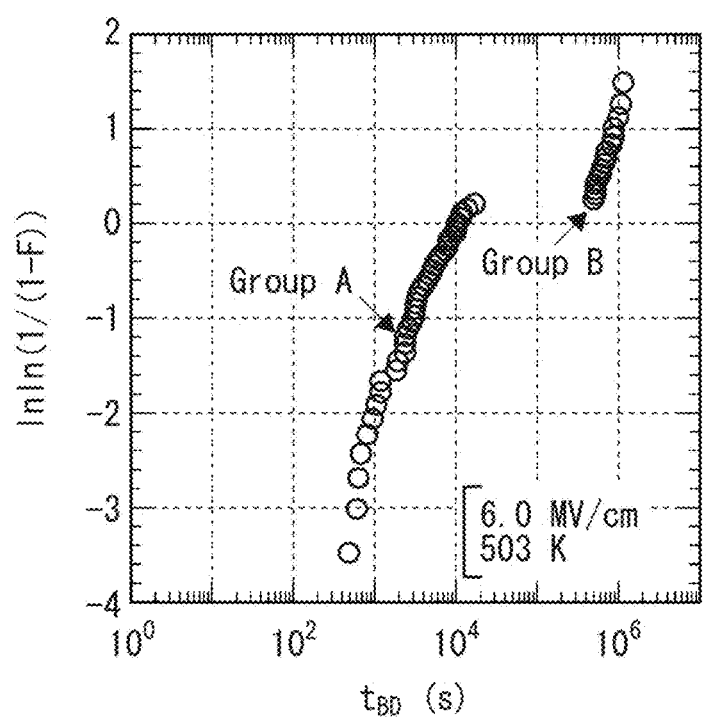
FIG. 14 is a graph illustrating the results of measurement of TDDB characteristics in depletion mode in an n-type MOS structure.

FIG. 14 is a graph illustrating the results of measurement of the TDDB characteristics in depletion mode in the n-type MOS structure. In FIG. 14, the lateral axis represents lifetime, $t_{BD}$. Further, the longitudinal axis represents the following value expressed by a function F:

$$\ln\ln\{1/(1-F)\} \qquad \text{[Numeral 1].}$$

Here, ln denotes a logarithm. In addition, F=i/N. Here, N dotes the number of evaluation samples; in addition, i denotes numerals corresponding to 1, 2, 3, . . . , and N in ascending order of lifetime of the samples. The following measurement condition was set: a stress temperature of 230° C., and reverse electric-field strength, $E_{OX}$=6.0 MV/cm.

The Weibull distribution of the lifetime $t_{BD}$ before breakdown was clearly classified into "group A", a group of shorter lifetime, and "group B", a group of longer lifetime. That is, a breakdown mode was presumed to consist of two modes.

To be specific, "group B" is a group of intrinsic breakdown that results from the inherent lifetime of an insulating film rather than from external factors. Moreover, "group A", whose breakdown comes earlier than "group B", is a group of faulty breakdown that is extrinsic independent of the inherent lifetime of the insulating film.

The external factors causing the faulty breakdown in "group A" seem to include various factors. Common examples of such factors include a process-derived factor, a defect within a drift layer, and a defect at the interface between a gate insulating film and the drift layer.

The inventors checked for a threading dislocation after measuring the TDDB in depletion mode, to find that all the elements corresponding to "group A" had threading dislocations in regions of drift layers, the regions facing gate electrodes via gate insulating films.

Figure 16:
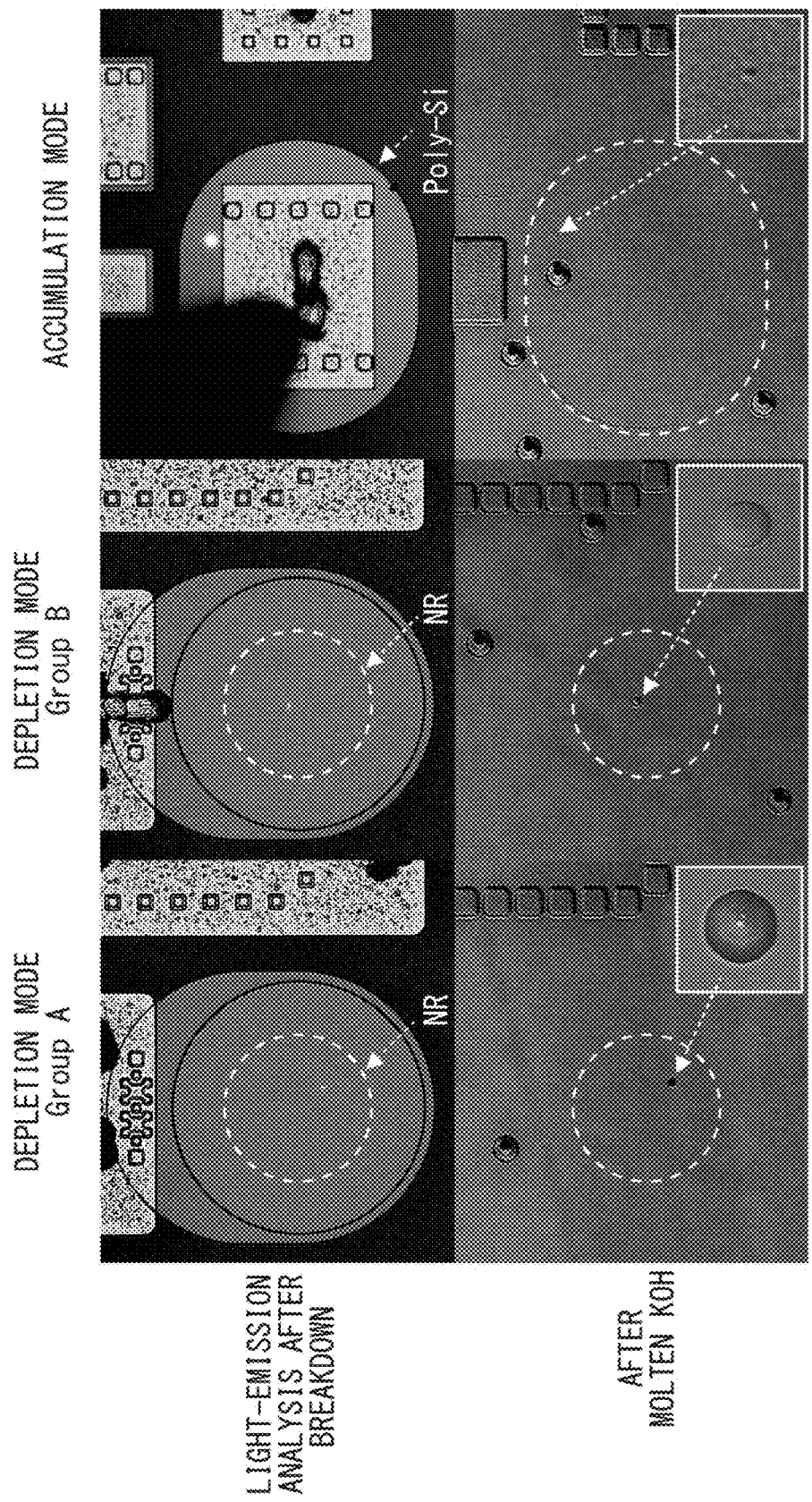
FIG. 16 illustrates light emission analyses after the breakdown of the MOS structure, and the results of threading dislocation observation using molten KOH.

The inventors further analyzed the light emissions illustrated in the upper stage of FIG. 16 and observed, using molten KOH, the threading dislocations illustrated in the lower stage of FIG. 16, to determine that the sites of breakdown in the elements corresponding to "group A" coincided with the sites of the threading dislocation TD. Here, FIG. 16 illustrates light emission analyses after the breakdown of the MOS structure, and the results of threading dislocation observation using molten KOH. The upper stage of FIG. 16 illustrates, sequentially from the left, the light emission analysis in "group A" in depletion mode, the light emission analysis in "group B" in depletion mode, and the light emission analysis in accumulation mode. Moreover, the lower stage of FIG. 16 illustrates, sequentially from the left, the appearance of the threading dislocation observed using molten KOH in "group A" in depletion mode, the appearance of the threading dislocation observed using molten KOH in "group B" in depletion mode, and the appearance of the threading dislocation observed using molten KOH in accumulation mode.

That is, the inventors found that the threading dislocation had a characteristic of degrading the insulating-film's lifetime resulting from the TDDB in depletion mode. In addition, the inventors have found that an insulating film formed in a position having a threading dislocation locally breaks down when receiving a reverse electric-field.

Meanwhile, while the MOSFET is ON, the JFET region includes an n-type MOS structure in accumulation form and the gate insulating film to which a forward electric-field is applied. A typical evaluation of insulating film reliability in the n-type MOS structure is reportedly TDDB characteristics in accumulation mode.

Figure 15:
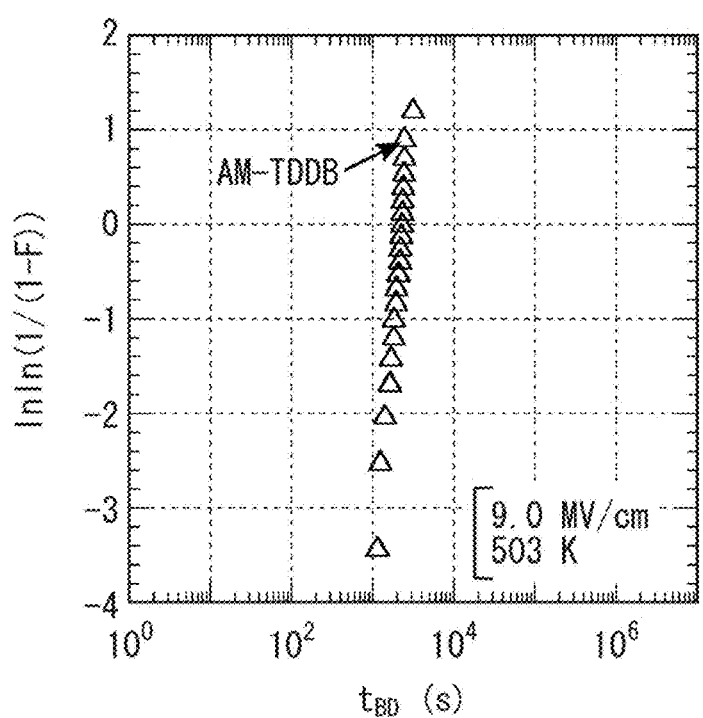
FIG. 15 is a graph illustrating the results of measurement in measuring TDDB characteristics in accumulation mode with regard to an element having the same n-type MOS structure as the element that has undergone measurement of the TDDB characteristics in depletion mode in FIG. 14.

FIG. 15 is a graph illustrating the results of measuring the TDDB characteristics in accumulation mode with regard to an element having the same n-type MOS structure as the element that has undergone measurement of the TDDB in depletion mode in FIG. 14. In FIG. 15, the lateral axis represents lifetime $t_{BD}$. Further, the longitudinal axis represents the following value expressed by a function F:

$$\ln\ln\{1/(1-F)\}. \qquad \text{[Numeral 2]}$$

The following measurement condition was set: a stress temperature of 230° C., and forward electric-field strength, $E_{OX}$=9.0 MV/cm.

The Weibull distribution was linear in the TDDB characteristics in accumulation mode. Accordingly, the breakdown mode resulting from the TDDB characteristics in accumulation mode seems to be intrinsic breakdown alone. That is, the breakdown mode of the insulating film, resulting from the TDDB characteristics in accumulation mode seems to not depend upon the threading dislocation TD.

The inventors also determined no threading dislocation at the site of breakdown in the element that has been broken down by the TDDB characteristics in accumulation mode, as illustrated in the right column of FIG. 16.

As described above, the inventors found that the threading dislocation degraded only the TDDB characteristics in depletion mode in the insulating film. That is, the inventors have found that the insulating film on the JFET region in the position having the threading dislocation, tends to locally break down while the MOSFET is OFF. This finding has revealed that improving the TDDB characteristics in depletion mode in a gate insulating film formed above a site of threading dislocation is important to improve the reliability of an insulating film of a MOSFET.

The inventors next varied the condition of a N doping profile, iNR, in the n-type MOS structure, to prepare a MOS structure modulating SiC electric-field strength, $E_{SiC}$, within a depletion layer when the same reverse electric-field strength $E_{OX}$ was set. The inventors then evaluated TDDB in depletion mode.

Figure 17:
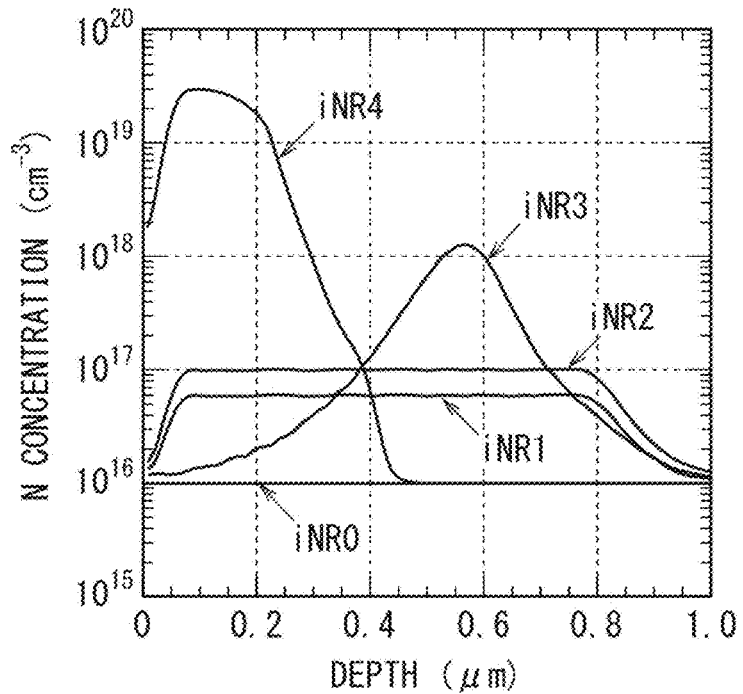
FIG. 17 is a graph illustrating N concentration in N doping profiles: iNR0, iNR1, iNR2, iNR3, and iNR4.

FIG. 17 is a graph illustrating N concentration in the aforementioned N doping profiles: iNR0, iNR1, iNR2, iNR3, and iNR4. In FIG. 17, the longitudinal axis represents N concentration (cm$^{-3}$); and the lateral axis, depth (μm).

Figure 18:
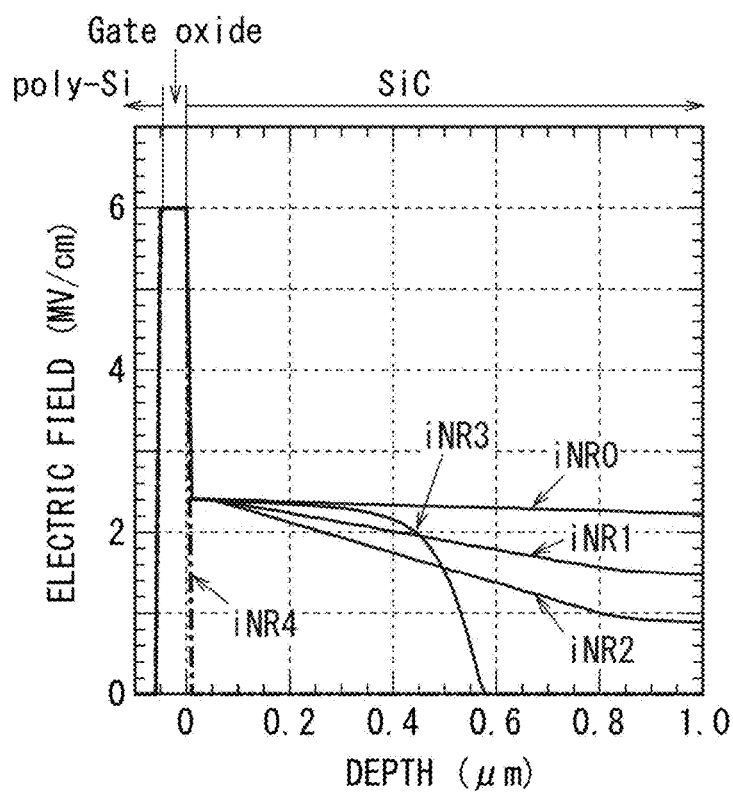
FIG. 18 is a graph illustrating the depth dependence of electric field in iNR0, iNR1, iNR2, iNR3, and iNR4.

When $E_{OX}$ is set to be 6.0 MV/cm, for instance, the depth dependence of the SiC electric-field strength $E_{SiC}$ in iNR0, iNR1, iNR2, iNR3, and iNR4 is calculated as indicated by FIG. 18. Here, FIG. 18 is a graph illustrating the depth dependence of the electric fields in iNR0, iNR1, iNR2, iNR3, and iNR4. In FIG. 18, the longitudinal axis represents electric field (MV/cm); and the lateral axis, depth (μm).

As illustrated in FIG. 18, particularly in iNR4, the depletion layer little extends due to its high doping concentration; thus, the SiC electric-field strength $E_{SiC}$ is 0 MV/cm in a region other than a region close to a MOS interface.

Figure 19:
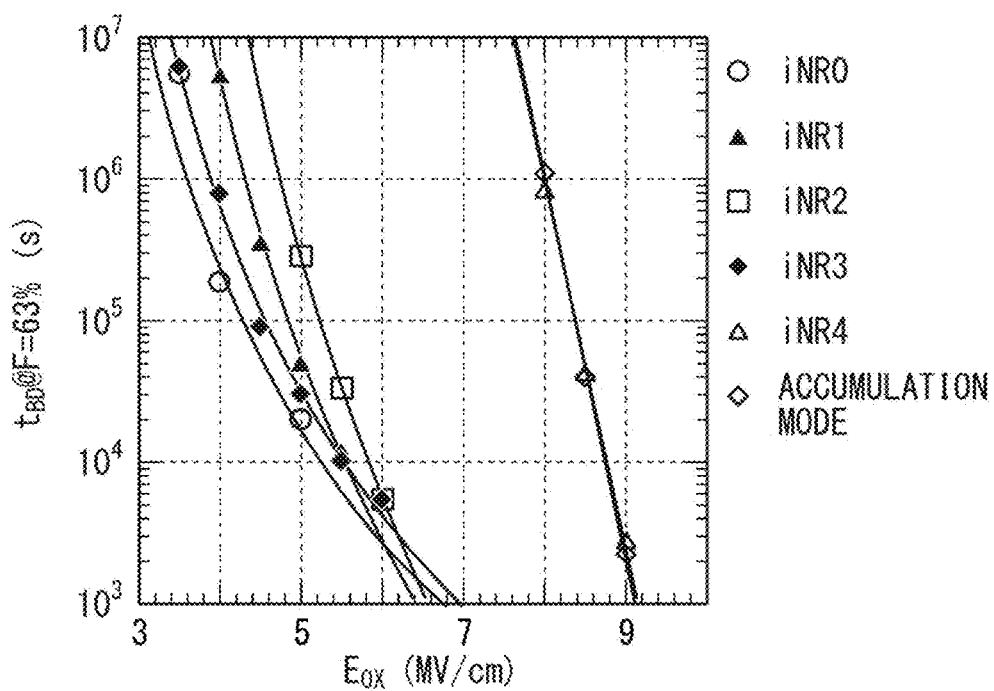
FIG. 19 is a graph illustrating the $E_{OX}$ dependence in lifetime, $t_{BD}$, in F=63% in "group A".

FIG. 19 is graph illustrating the $E_{OX}$ dependence of the lifetime $t_{BD}$ in F=63% in "group A". In FIG. 19, the longitudinal axis represents lifetime $t_{BD}$(s); and the lateral axis, $E_{OX}$ (MV/cm).

As illustrated in FIG. 19, $t_{BD}$-$E_{OX}$ characteristics obtained by the TDDB in depletion mode highly depends upon iNR. In iNR4 in particular, obtained were characteristics almost equal to the $t_{BD}$-$E_{OX}$ characteristics obtained by TDDB in accumulation mode.

This fact has revealed that the lifetime $t_{BD}$ in the TDDB in depletion mode highly depends not only upon $E_{OX}$, but also upon $E_{SiC}$. That is, the fact has revealed that a stress factor resulting from the SiC electric-field strength $E_{SiC}$ within the depletion layer causes the lifetime to in the TDDB in depletion mode except iNR4 to be shorter, in equal $E_{ox}$, than the lifetime $t_{BD}$ in the TDDB in accumulation mode.

FIGS. 20 to 25 are graphs illustrating the $E_{SiC}$ dependence of the lifetime $t_{BD}$ in F=63%. In each drawing, the vertical axis denotes the lifetime $t_{BD}$(s); and the lateral axis, $E_{SiC}$ (MV/cm).

Figure 20:
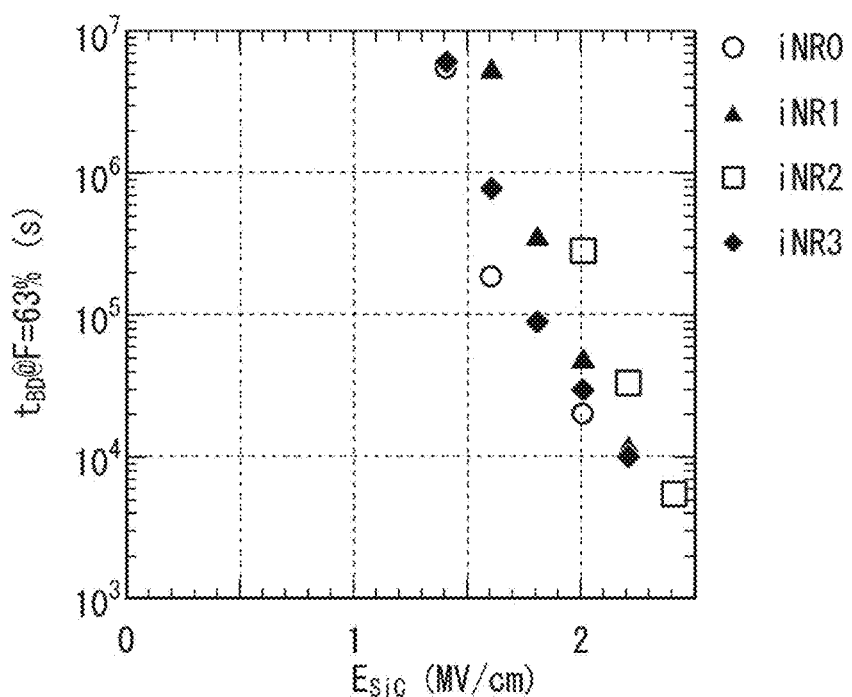
FIG. 20 is a graph illustrating the $E_{SiC}$ dependence in the lifetime $t_{BD}$ in F=63%.
Figure 23:
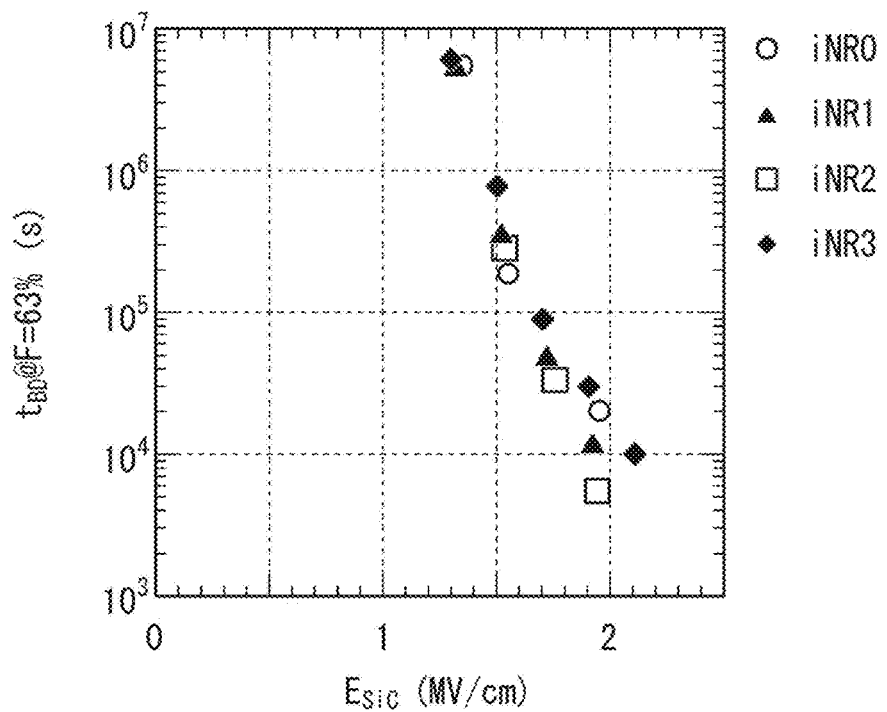
FIG. 23 is a graph illustrating the $E_{SiC}$ dependence in the lifetime $t_{BD}$ in F=63%.

Here, FIG. 20 corresponds to $E_{SiC}$ at a depth of 0.0 μm from the MOS interface. Further, FIG. 21 corresponds to $E_{SiC}$ at a depth of 0.1 m from the MOS interface.

Still further, FIG. 22 corresponds to $E_{SiC}$ at a depth of 0.2 μm from the MOS interface. Yet further, FIG. 23 corresponds to $E_{SiC}$ at a depth of 0.3 μm from the MOS interface.

Figure 24:
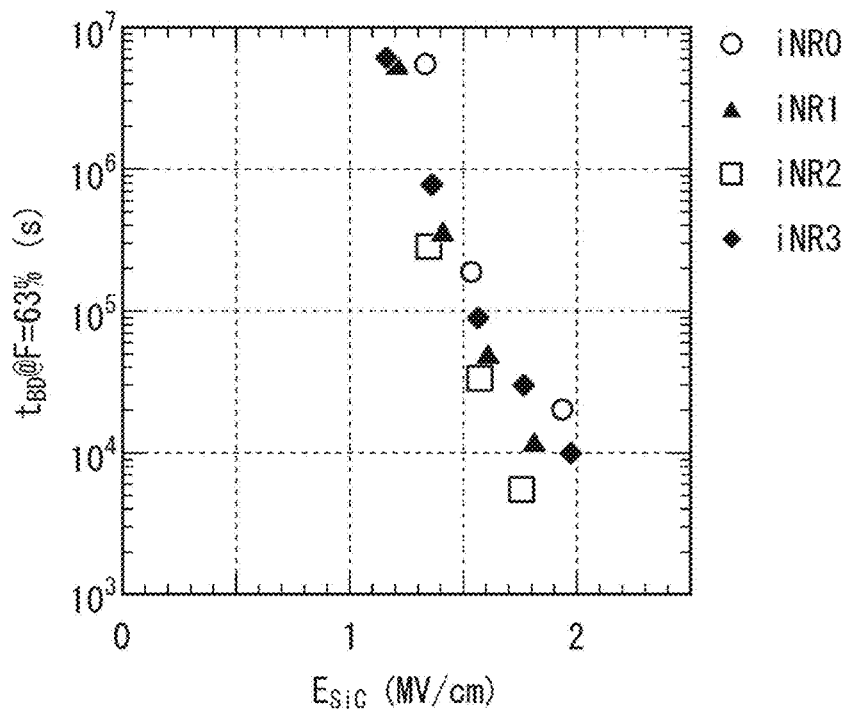
FIG. 24 is a graph illustrating $E_{SiC}$ dependence in the lifetime $t_{BD}$ in F=63%.
Figure 25:
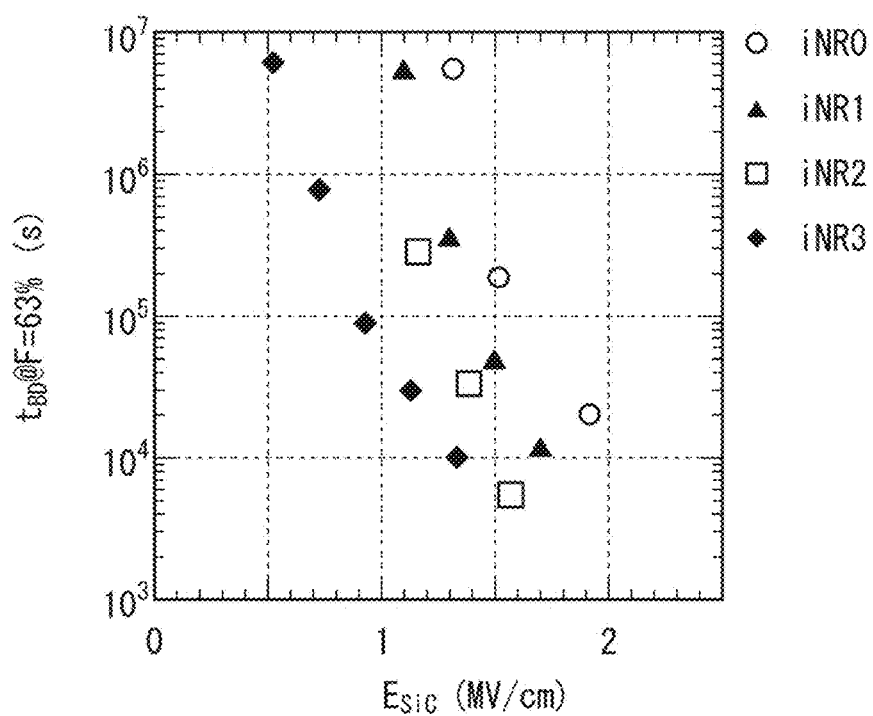
FIG. 25 is a graph illustrating the $E_{SiC}$ dependence in the lifetime $t_{BD}$ in F=63%.

Still yet further, FIG. 24 corresponds to $E_{SiC}$ at a depth of 0.4 μm from the MOS interface. Still further, FIG. 25 corresponds to $E_{SiC}$ at a depth of 0.5 μm from the MOS interface.

The lifetime to correlates with $E_{SiC}$ at a depth of 0.1 μm or more and 0.4 μm or less from the MOS interface. In particular, the lifetime $t_{BD}$ best correlated with $E_{SiC}$ at a depth of 0.2 μm or more and 0.3 μm or less.

This result has revealed that $E_{SiC}$ at a depth of 0.1 μm or more and 0.4 μm or less from the MOS interface, more strictly, $E_{SiC}$ at a depth of 0.2 μm or more and 0.3 μm or less from the MOS interface, is a key factor in determining the lifetime $t_{BD}$.

The foregoing study has presumed that the aforementioned breakdown occurs in the following mechanism. In the TDDB in depletion mode, the potential at the MOS interface is higher than the gate electrode. This causes an electric field in the gate insulating film.

The electric field causes carrier electrons to slightly undergo tunnel leakage from the gate electrode. The carrier electrons are then accelerated by a high electric field within the gate insulating film and are further injected to SiC. At this stage, the carrier electrons with high energy cause impact ionization within SiC, thus generating hole carriers under the MOS interface.

These holes undergo electric-field acceleration using a SiC electric field within the depletion layer to gain high energy, and then collide against the MOS interface or are injected again inside the gate insulating film. This causes the time deterioration of the gate insulating film.

The energy, gained by the hole carriers, is determined by the SiC electric-field strength $E_{SiC}$. Hence, the lifetime $t_{BD}$ depends upon $E_{SiC}$. The aforementioned experiment's results have revealed that the energy gained by the hole carriers from a region at a depth of 0.1 μm or more and 0.4 μm or less from the MOS interface, to be more specific, from $E_{SiC}$ at a depth of 0.2 μm or more and 0.3 μm or less from the MOS interface, is a key factor in determining the lifetime $t_{BD}$. Furthermore, these holes are apt to concentrate on the threading dislocation; hence, the gate insulating film immediately above the threading dislocation presumably tends to break down.

As such, the foregoing study has suggested that lifetime improvement against a stress in depletion mode or in the Off state of the MOSFET requires a reduction in $E_{SiC}$ in a region having a depth of 0.1 μm or more and 0.4 μm or less from the MOS interface.

<Effects of Embodiment>

The following illustrates effects of the embodiment. Although these effects are based on specific configurations described in the embodiment, these specific configurations may be replaced with different specific embodiments described in the Description within a range achieving like effects.

In a conventional MOSFET structure, a threading dislocation in a region where a drift layer is in contact with a gate insulating film causes stress concentration near the region. The stress concentration unfortunately causes the gate insulating film to locally break down.

To solve the problem, a structure has been proposed that includes an electric-field reduction region of p-type in part of a JFET region. However, the electric-field reduction region of p-type in the structure has been formed on the basis of a pattern design regardless of the position of the threading dislocation.

Then, the electric-field reduction region serves as an energy barrier in carrier-electron's enter into the JFET region from a source region via a MOS channel region while the MOSFET is ON. This prevents electrical conduction, thereby increasing an ON-resistance.

A MOSFET structure has been conventionally proposed that includes an electric-field reduction region formed, through Al-ion implantation, in a position provided with a threading dislocation TD. However, implantation depth is desirably as shallow as possible in view of establishing a tail profile on the deeper side of the ion to be implanted, and removing all the implantation layers in a region having no threading dislocation afterward.

Figure 26:
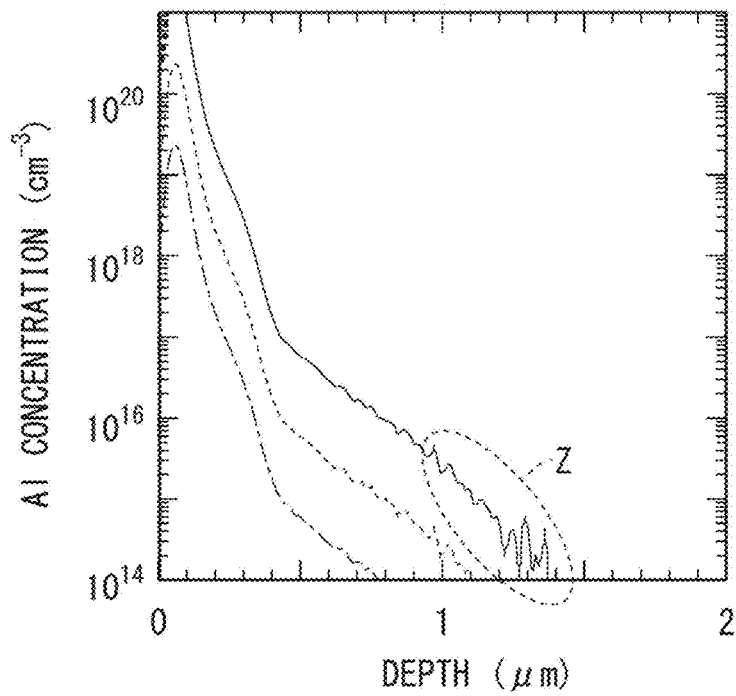
FIG. 26 is a graph illustrating a profile in ion implantation.
Figure 28:
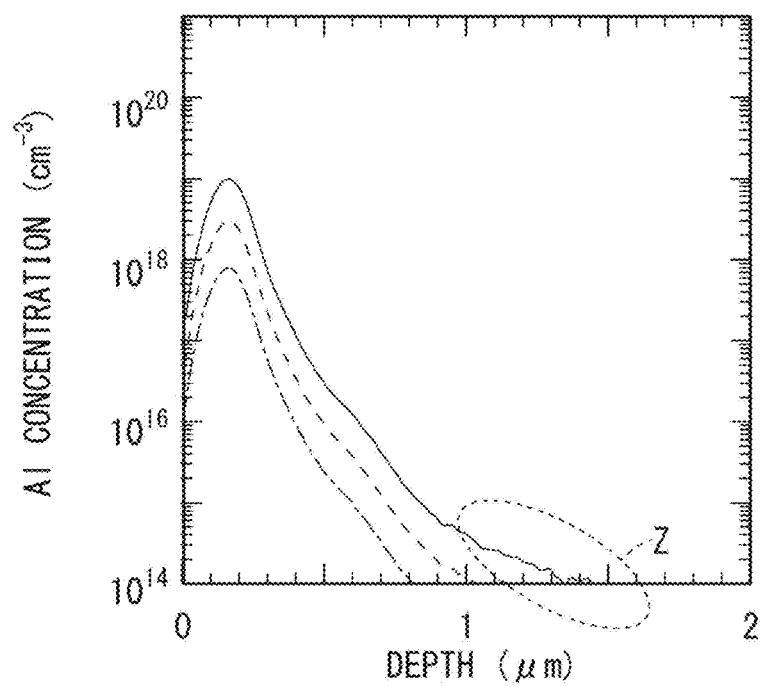
FIG. 28 is a graph illustrating a profile in ion implantation.
Figure 30:
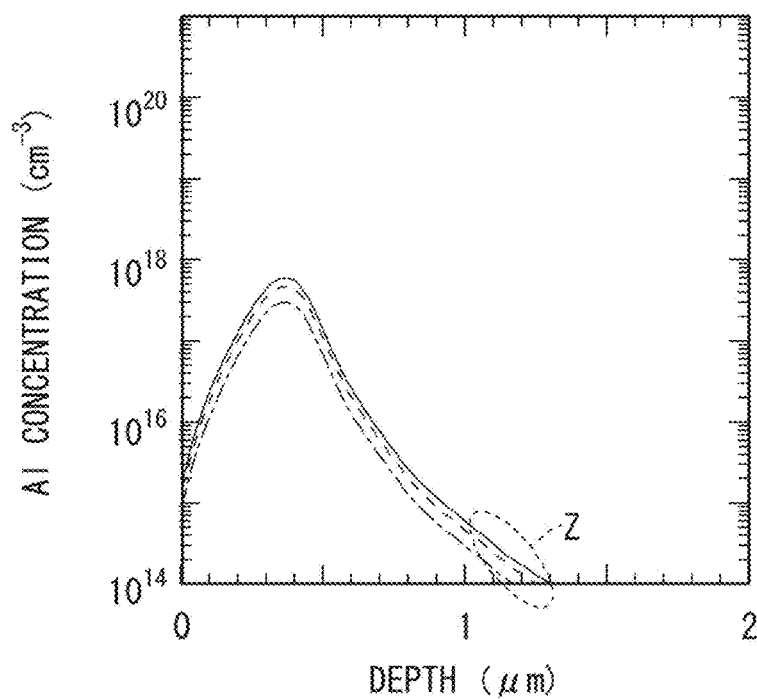
FIG. 30 is a graph illustrating a profile in ion implantation.

FIGS. 26, 28, and 30 are graphs illustrating the profiles in ion implantation. In each drawing, the vertical axis denotes the concentration of Al (cm$^{-3}$); and the lateral axis, depth (μm).

Figure 27:
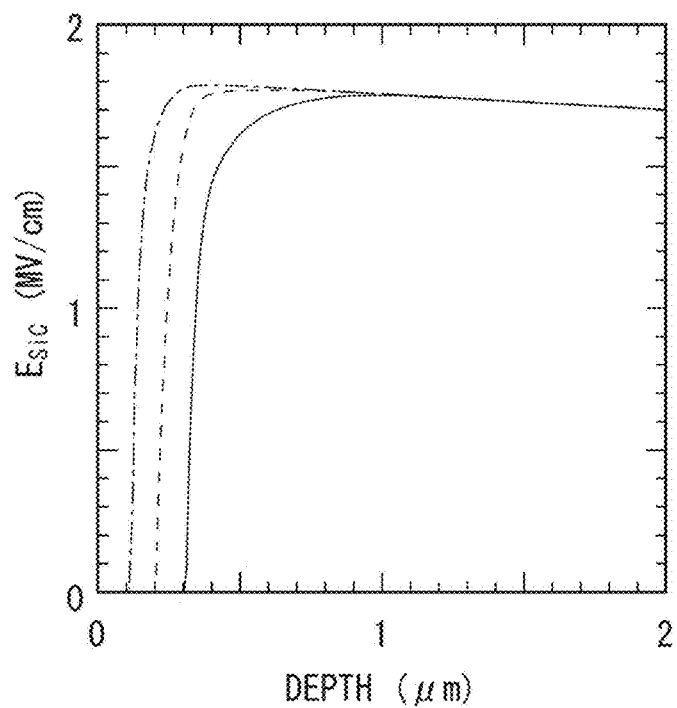
FIG. 27 is a graph illustrating an electric-field reduction effect achieved under ion implantation with the profile illustrated in FIG. 26.
Figure 29:
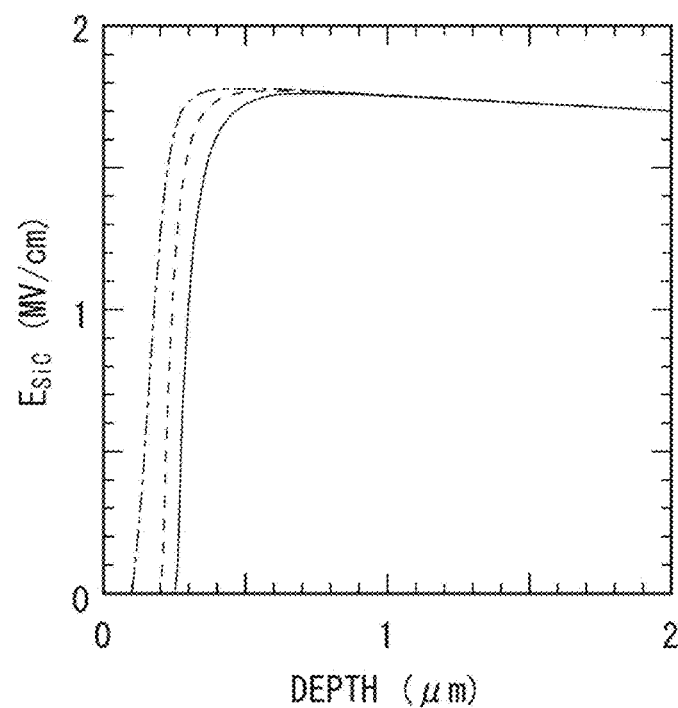
FIG. 29 is a graph illustrating an electric-field reduction effect achieved under ion implantation in the profile illustrated in FIG. 28.
Figure 31:
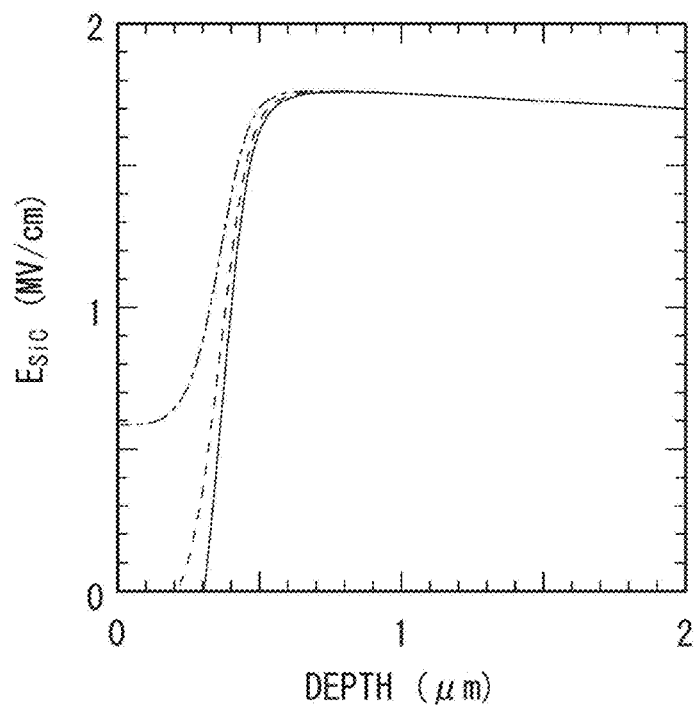
FIG. 31 is a graph illustrating an electric-field reduction effect achieved under ion implantation with the profile illustrated in FIG. 30.

FIGS. 27, 29, and 31 are graphs illustrating electric-field reduction effects in ion implantation. In each drawing, the vertical axis denotes $E_{SiC}$ (MV/cm); and the lateral axis, depth (μm).

It is noted that FIG. 27 illustrates the electric-field reduction effect achieved under ion implantation in the profile illustrated in FIG. 26.

It is also noted that FIG. 29 illustrates the electric-field reduction effect achieved under ion implantation in the profile illustrated in FIG. 28.

It is also noted that FIG. 31 illustrates the electric-field reduction effect achieved under ion implantation in the profile illustrated in FIG. 30.

Shallow ion implantation that peaks at a depth of 0.05 µm, as illustrated in FIG. 26, will achieve the electric-field reduction effect as illustrated in FIG. 27, but will increase a necessary dose. After all, the tail profile is established in a position deeper than a depth of 1 µm, as indicated by Z in FIG. 26.

As illustrated in FIG. 28 or FIG. 30, ion implantation using high energy reduces the dose necessary for achieving the electric-field reduction effect, as illustrated in the corresponding drawing, FIG. 29 or FIG. 31 The tail profile unfortunately extends to a depth of the order of 1 µm or the order of 2 µm, as indicated by Z in FIGS. 28 and 30.

As such, completing this self-alignment process requires a pit in a region having a threading dislocation to have a depth of 1 µm or more, or 2 µm or more. This process is extremely inefficient and builds a hurdle to maintain high in-plane homogeneity, thus considerably degrading process throughput or yield.

Figure 32:
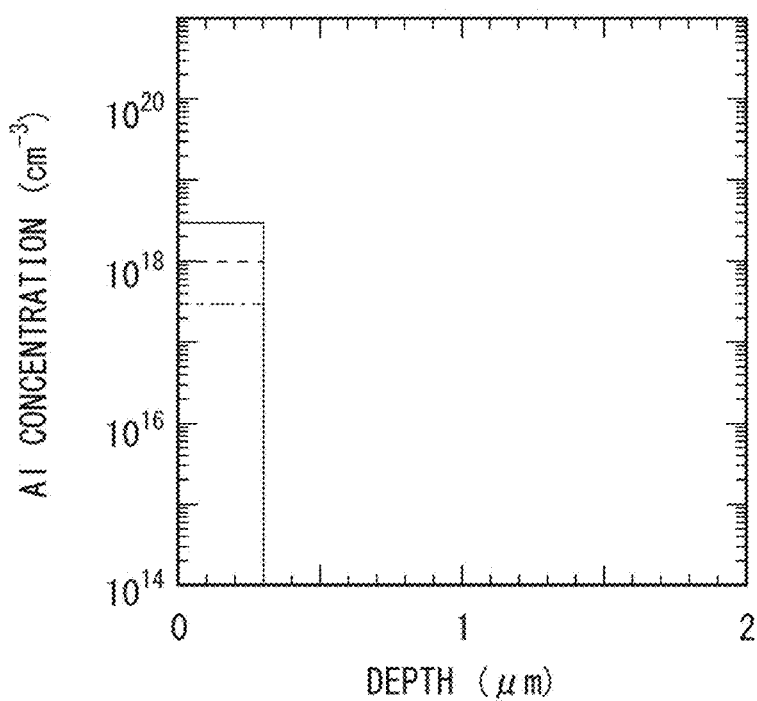
FIG. 32 is a graph illustrating the Al-doping profile in a p-type epitaxial layer.
Figure 34:
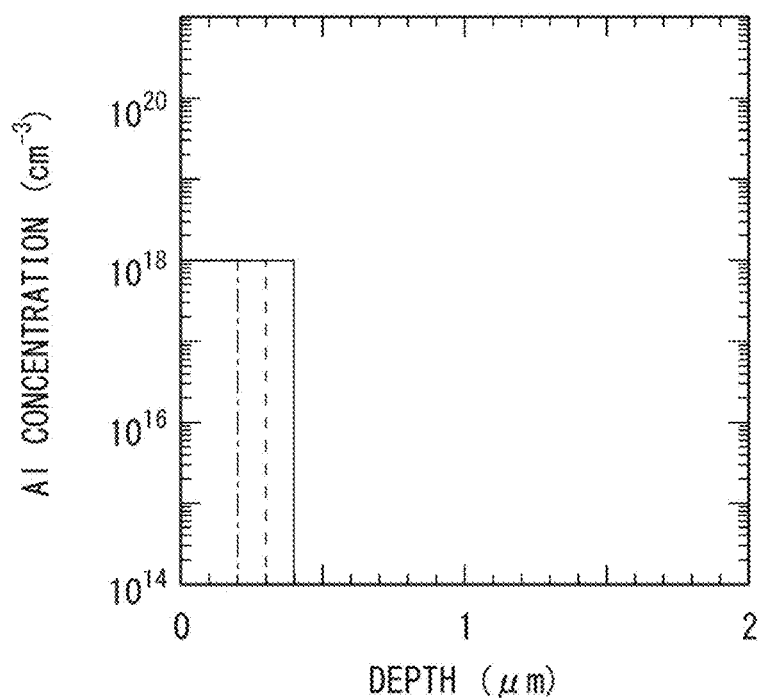
FIG. 34 is a graph illustrating the Al-doping profile in the p-type epitaxial layer.

FIGS. 32 and 34 are graphs illustrating the Al-doping profiles of a p-type epitaxial layer. In each drawing, the vertical axis denotes the concentration of Al ($cm^{-3}$); and the lateral axis, depth (µm).

Figure 33:
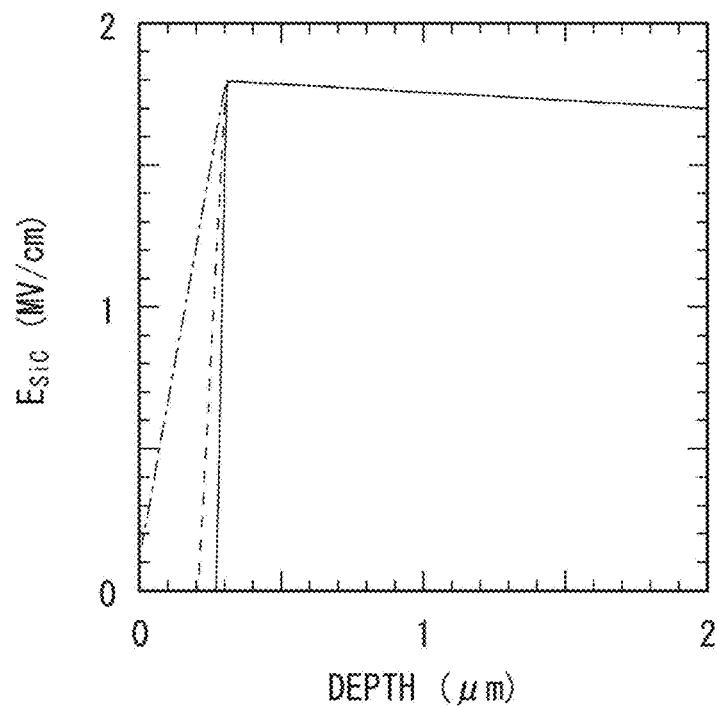
FIG. 33 is a graph illustrating an electric-field reduction effect in the profile illustrated in FIG. 32 with the p-type epitaxial layer buried.
Figure 35:
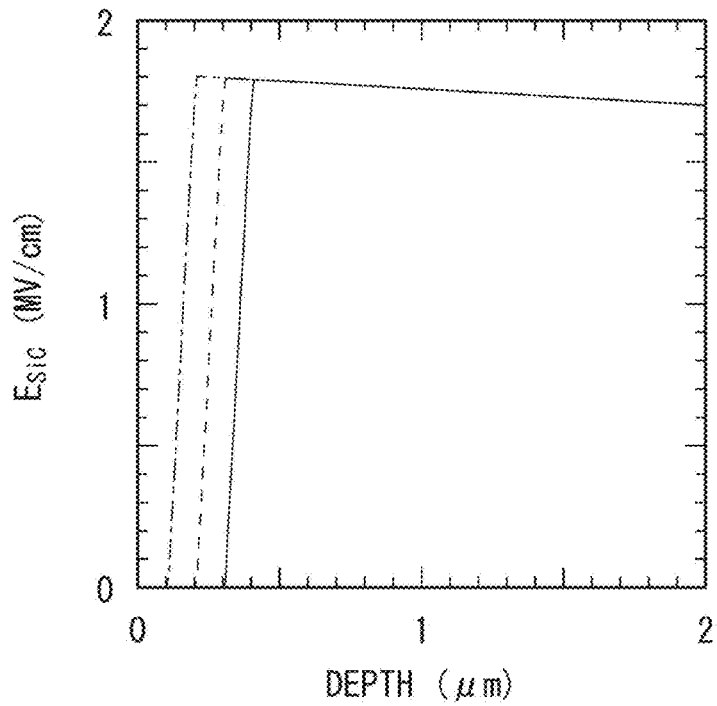
FIG. 35 is a graph illustrating an electric-field reduction effect in the profile illustrated in FIG. 34 with the p-type epitaxial layer buried.

FIGS. 33 and 35 are graphs illustrating electric-field reduction effects in the p-type epitaxial layer as buried. In each drawing, the vertical axis denotes $E_{SiC}$ (MV/cm); and the lateral axis, depth (µm).

It is noted that FIG. 33 illustrates the electric-field reduction effect achieved under ion implantation in the profile illustrated in FIG. 32.

It is also noted that FIG. 35 illustrates the electric-field reduction effect achieved under ion implantation in the profile illustrated in FIG. 34.

The method using the p-type epitaxial growth in the embodiment achieves an electric-field reduction effect equal to that described above with a p-type dopant establishing no tail profile, as illustrated in FIG. 32 or FIG. 34. This fact is demonstrated in FIG. 33, corresponding to the ion implantation in FIG. 32, and FIG. 35, corresponding to the ion implantation in FIG. 34.

Figure 36:
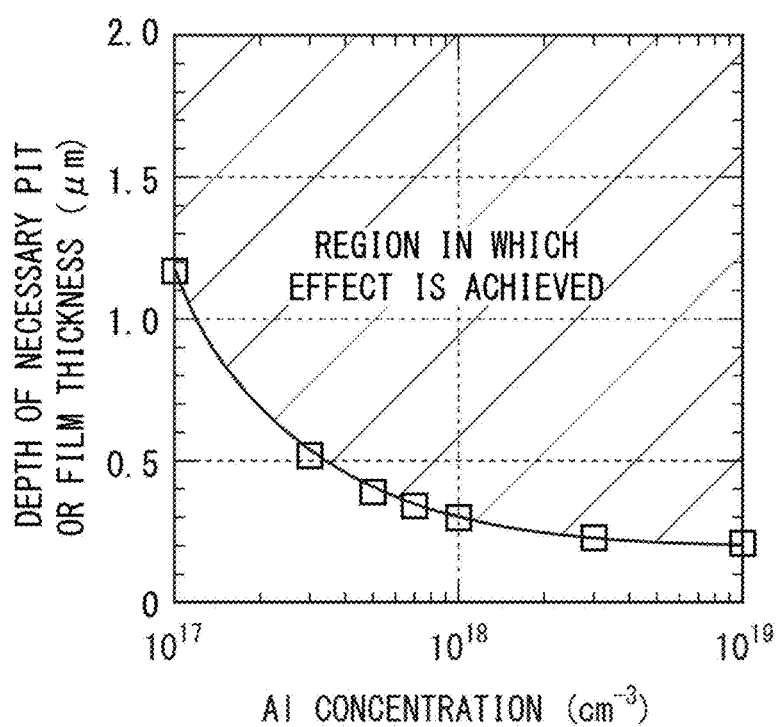
FIG. 36 is a graph illustrating a trade-off relationship between the concentration of Al in the electric-field reduction region and the depth of a necessary pit, according to the embodiment.
Figure 37:
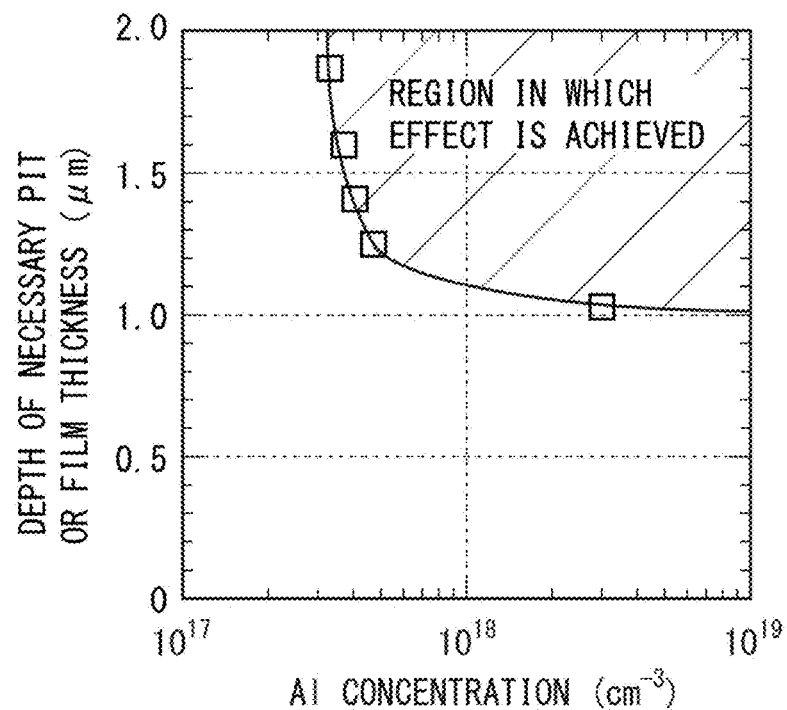
FIG. 37 is a graph illustrating a trade-off relationship between the concentration of Al in an electric-field reduction region and the depth of a necessary pit, according to a conventional configuration.

FIG. 36 is a graph illustrating a trade-off relationship between the concentration of Al in the electric-field reduction region and the depth of a necessary pit, according to the embodiment. FIG. 37 is a graph illustrating a trade-off relationship between the concentration of Al in an electric-field reduction region and the depth of a necessary pit, according to a conventional configuration.

As illustrated in FIG. 36, the p-type epitaxial growth in the embodiment improves the trade-off relationship between the concentration of Al (peak concentration in ion implantation) in the electric-field reduction region 12 and the depth of the necessary pit. This enables the electric-field reduction region 12 to be disposed in only a position having the threading dislocation TD without degrading the throughput or yield.

This prevents an electric-field reduction region located at an unnecessary site from increasing an ON-resistance; at the same time, the gate insulating film on the JFET region is prevented from degradation during the Off period. In addition, the reliability is improved.

The foregoing has described that the electric-field reduction region improves the reliability of the gate insulating film located above the threading dislocation in the JFET region. As a matter of course, the electric-field reduction region improves the reliability of an insulating film disposed in a position having a threading dislocation, in a MOS structure located in, for instance, a terminal region of the MOSFET.

The ON-resistance of the SiC-MOSFET is the sum of, mainly, a channel resistance, a JFET resistance, a drift layer resistance, and a SiC substrate resistance. The JFET resistance increases as the depletion region extending between the JFET region and the adjacent well regions expands during the ON period.

Increasing the concentration of an n-type dopant in the JFET region reduces the width of the depletion region, thus lowering the JFET resistance. This, however, increases the electric field applied to the gate insulating film positioned on the JFET region during the OFF period. Hence, the JFET resistance and element lifetime for reliability establish a trade-off relationship.

The configuration in the embodiment improves the lifetime $t_{BD}$. This means that the configuration can set high $E_{OX}$ necessary for achieving an equal element lifetime.

Figure 38:
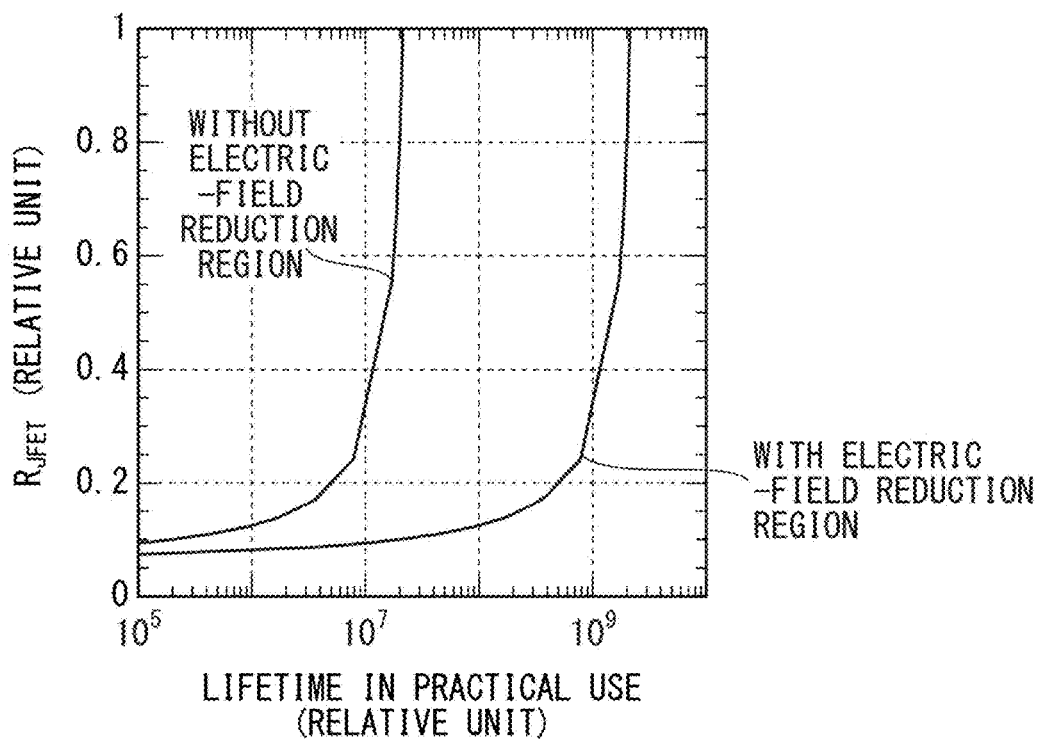
FIG. 38 is a graph illustrating a trade-off relationship between a JFET resistance and lifetime in practical use.

FIG. 38 is a graph illustrating a trade-off relationship between the JFET resistance and the lifetime in practical use. In FIG. 38, the vertical axis denotes the JFET resistance, $R_{JFET}$; and the lateral axis, the lifetime in practical use.

As illustrated in FIG. 38, the configuration in the embodiment improves the trade-off relationship.

According to the embodiment, the silicon carbide semiconductor device includes the drift layer 2 of n-type, the threading dislocation TD, and the electric-field reduction region 12 of the second conductivity type (p-type). The threading dislocation TD penetrates the drift layer 2. The electric-field reduction region 12 is disposed in a position in the surface layer of the drift layer 2, the position corresponding to the threading dislocation TD. The electric-field reduction region 12 is an epitaxial layer.

Such a configuration, in which the electric-field reduction region 12 of p-type is the epitaxial layer, fails to establish the tail profile of the p-type dopant. This prevents the dielectric breakdown during the OFF state of the silicon carbide semiconductor device without degrading the process throughput or yield. In addition, the configuration greatly improves the trade-off relationship between the ON-characteristics of the silicon carbide semiconductor device, and the lifetime for the reliability of the silicon carbide semiconductor device during its OFF state.

It is noted that the configurations illustrated in the Description other than these configurations can be omitted as necessary. That is, these configurations alone can bring the aforementioned effects.

However, the above configurations can additionally include at least one of the other configurations illustrated in the Description as necessary; that is, the above configurations can additionally include the other configurations described in the Description that are excluded from these configurations. Such additionally included configurations can still bring the aforementioned effect.

According to the embodiment, the electric-field reduction region 12 is at least partly buried in a position in the surface layer of the drift layer 2, the position corresponding to the threading dislocation TD. Such a configuration, in which the electric-field reduction region 12 is the epitaxial layer, fails to establish the tail profile of the Al dopant. This improves the reliability of the silicon carbide semiconductor device during its OFF state without degrading the process throughput or yield.

According to the embodiment, the silicon carbide semiconductor device includes an insulating film and an electrode. Here, the insulating film corresponds to, for instance, the gate insulating film 6. Further, the electrode corresponds to, for instance, the gate electrode 7. The gate insulating film 6 is disposed in a position on the upper surface of the drift layer 2, the position corresponding to the threading dislocation TD. The gate electrode 7 is disposed in a position on the upper surface of the gate insulating film 6, the position corresponding to the threading dislocation TD. Such a configuration, in which the electric-field reduction region 12 is the epitaxial layer, fails to establish the tail profile of the Al dopant. This improves the reliability of the gate insulating film 6 of the silicon carbide semiconductor device without degrading the process throughput or yield.

According to the embodiment, the silicon carbide semiconductor device includes the plurality of well regions 3 of p-type, the JFET region JR, and the source region 4 of n-type. The well regions 3 are disposed in the surface layer of the drift layer 2. The JFET region JR is sandwiched between the plurality of well regions 3. The source region 4 is disposed in a position in the surface layers of each well region 3, the position being spaced from the JFET region JR by the well region 3. The gate electrode 7 is disposed in a position on the upper surface of the gate insulating film 6, the position corresponding to the JFET region JR, and in another position on the upper surface of the gate insulating film 6, the other position corresponding to a portion between the source region 4 and the drift layer 2. Such a configuration, in which the electric-field reduction region 12 is the epitaxial layer, fails to establish the tail profile of the Al dopant. This improves the reliability of the gate insulating film 6 in the channel region and the JFET region JR without degrading the process throughput or yield.

According to the embodiment, the electric-field reduction region 12 is disposed in the surface layer of the JFET region JR. Such a configuration, in which the electric-field reduction region 12 is the epitaxial layer, fails to establish the tail profile of the Al dopant. This improves the reliability of the gate insulating film 6 in the JFET region JR without degrading the process throughput or yield.

According to the embodiment, the electric-field reduction region 12 is provided to be in contact with at least one of the plurality of well regions 3. Such a configuration enables the electric-field reduction region 12 to have a stable potential.

According to the embodiment, the following expressions are satisfied on an axis extending from the upper surface of the drift layer 2 including the electric-field reduction region 12 to the lower surface of the drift layer 2, where d [m] denotes the thickness of the electric-field reduction region 12, where $\varepsilon_\gamma$ [F/m] denotes the relative permittivity of silicon carbide, where $\varepsilon_o$ [F/m] denotes the vacuum permittivity of silicon carbide, where e [C] denotes the amount of an electron charge, where x [m] denotes a coordinate in a direction from the upper surface of the drift layer 2 serving as an origin point toward the lower surface of the drift layer 2, where $W_1$ [m] denotes the distance from the upper surface of the drift layer 2 serving as an origin point to a first end of the depletion layer produced during the OFF state of the silicon carbide semiconductor device, where $W_2$ [m] denotes the distance from the upper surface of the drift layer 2 serving as an origin point to a second end of the depletion layer produced in the OFF state of the silicon carbide semiconductor device, the first end being the end of the depletion layer on the lower-surface side of the drift layer 2, the second end being the end of the depletion layer on the upper-surface side of the drift layer 2, where $N_D(x)$ [m$^{-3}$] denotes the concentration of an impurity of the first conductivity type in the coordinate x, where $N_A(x)$ [m$^{-3}$] denotes the concentration of an impurity of the second conductivity type in the coordinate x, where E(x) [V/m] denotes electric-field strength in the coordinate x, where V [V] denotes the potential difference between the drain and source of the silicon carbide semiconductor device during the OFF state:

[Numeral 3]

$$1.0 \times 10^{-7} < W_2 < d, \tag{1}$$

[Numeral 4]

$$E(x) = -\frac{e}{\varepsilon_\gamma \varepsilon_o} \int_{W_1}^{x} \{N_D(x) - N_A(x)\}dx \; (W_2 \le x \le W_1), \tag{2}$$

[Numeral 5]

$$E(x = W_2) = E(x = W_1) = 0, \text{ and} \tag{3}$$

[Numeral 6]

$$V = \int_{W_2}^{W_1} E(x)dx. \tag{4}$$

Such a configuration, in which the electric-field reduction region 12 is the epitaxial layer, fails to establish the tail profile of the Al dopant.

According to the embodiment, the method for manufacturing the silicon carbide semiconductor device includes preparing a silicon carbide layer including the threading dislocation TD extending from the lower surface to upper surface of the silicon carbide layer. Here, the silicon carbide layer corresponds to the drift layer 2. The method also includes forming the pit PT in a position in the upper surface of the drift layer 2, the position corresponding to the threading dislocation TD. The method also includes after forming the pit PT, epitaxially growing the SiC epitaxial layer 11 of p-type on the upper surface of the drift layer 2. The method also includes partly removing the SiC epitaxial layer 11 while leaving a portion buried in the pit PT unremoved, to form the electric-field reduction region 12.

Such a configuration, in which the electric-field reduction region 12 of p-type is formed through epitaxial growth, fails to establish the tail profile of the p-type dopant. This improves the reliability of the silicon carbide semiconductor device during its OFF state without degrading the process throughput or yield. In addition, the configuration greatly improves the trade-off relationship between the ON-characteristics of the silicon carbide semiconductor device, and the lifetime for the reliability of the silicon carbide semiconductor device during its OFF state.

It is noted that the configurations illustrated in the Description other than these configurations can be omitted as necessary. That is, these configurations alone achieve the aforementioned effects.

However, the above configurations can additionally include at least one of the other configurations illustrated in the Description as necessary; that is, the above configurations can additionally include the other configurations described in the Description that are excluded from these configurations. Such additionally included configurations can still bring the aforementioned effect.

Unless otherwise limited, these processes are performed in changeable order.

According to the embodiment, forming the pit PT includes forming the thermal oxide film 10 on the upper surface of the drift layer 2, and further removing the thermal oxide film 10 through wet etching. Such a configuration enables the pit PT to be formed in a site provided with the threading dislocation TD, by the use of rapid oxidation in the threading dislocation TD.

According to the embodiment, forming the pit PT includes dry-etching the upper surface of the drift layer 2 through annealing within a hydrogen gas. Such a configuration enables the pit PT to be formed by a simple method.

According to the embodiment, forming the electric-field reduction region 12 while leaving the portion buried in the pit PT unremoved includes forming an etching mask all over the upper surface of the SiC epitaxial layer 11, and further dry-etching the upper surface of the SiC epitaxial layer 11 via the etching mask. Such a configuration, in which the electric-field reduction region 12 of p-type is formed through epitaxial growth, fails to establish the tail profile of the p-type dopant.

According to the embodiment, forming the electric-field reduction region 12 while leaving the portion buried in the pit PT unremoved includes depositing a silicon oxide film all over the upper surface of the SiC epitaxial layer 11 to form an etching mask, and further dry-etching the upper surface of the SiC epitaxial layer 11 via the etching mask. Such a configuration, in which the electric-field reduction region 12 of p-type is formed through epitaxial growth, fails to establish the tail profile of the p-type dopant.

According to the embodiment, forming the electric-field reduction region 12 includes partly removing the SiC epitaxial layer 11 through polishing while the portion buried in the pit PT unremoved. Such a configuration, in which the electric-field reduction region 12 of p-type is formed through epitaxial growth, fails to establish the tail profile of the p-type dopant.

<Modifications of Embodiment>

As illustrated in, for instance, FIG. 2, the electric-field reduction region 12 in the embodiment is connected to the well regions 3. Nevertheless, the electric-field reduction region, when having a stable potential, may be spaced from the well regions.

The plane orientation of the surface of the silicon carbide substrate is not limited to (0001). The plane orientation may be, for instance, (000-1) or (11-20). The surface of the silicon carbide substrate may have an off-angle with respect to the plane orientation.

The mask used in selective ion implantation is not limited to the resist mask. A mask of oxide film may be used.

The silicon carbide semiconductor device, although being a MOSFET in the embodiment, may be a metal-insulator-semiconductor field-effect transistor (MISFET).

Further, the silicon carbide semiconductor device may be not limited to the MISFET. The silicon carbide semiconductor device may be, for instance, an IGBT. To form the IGBT, the conductivity type of the SiC substrate 1 is changed from an n-type to a p-type, for instance.

The silicon carbide semiconductor device, although being a MOSFET, MISFET, or IGBT that includes a gate insulating film in the above description, may be, for instance a Schottky barrier diode (SBD) that includes no gate insulating film. In this case, the electric-field reduction region of p-type prevents the degradation of a Schottky barrier interface in a region near the threading dislocation TD.

In the embodiment, the first conductivity type is an n-type; and the second conductivity, a p-type. The conductivity types may be interchanged. In this case, the donor and the acceptor are also interchanged.

The ion implantation steps for doping a conductive impurity is performed in interchangeable order. Consequently, a p-channel MOSFET is achieved instead of an n-channel MOSFET.

The embodiment can describe the material quality, material, size, and shape of each component, the positions of components relative to each other, conditions for implementation, and other things. They are all illustrative in all aspects, and are thus not limited to what are described in the Description.

Accordingly, numerous variations and equivalents that are not illustrated herein can be assumed within the range of the technique disclosed in the Description. For instance, the modification, addition, or omission of at least one component will be included.

Unless otherwise contradicted, "one" component described in the embodiment may include "one or more" components.

Further, individual components are conceptual units. Thus, within the range of the technique disclosed in the Description, one component may include multiple structures, one component may correspond to part of some structure, and multiple components may be included in one structure.

Each component includes a structure having a different configuration or a different shape as long as the structure of the different configuration or the different shape achieves the same function.

What has been described in the Description are referred for all purposes regarding the present technique. It is thus not an admission that any of the descriptions provided herein are conventional techniques.

If the aforementioned embodiments contain descriptions about materials that are not particularly specified, it is to be understood that an example of these materials is an alloy containing other additives within these materials unless otherwise contradicted.

EXPLANATION OF REFERENCE SIGNS

1 SiC substrate, 2 drift layer, 3 well region, 4 source region, 5 contact region, 6 gate insulating film, 7 gate electrode, 8 source electrode, 9 drain electrode, 10 thermal oxide film, 11 SiC epitaxial layer, 12 electric-field reduction region, 30 SiC layer, 100 depletion layer, JR JFET region, S1 lower surface, S2 upper surface, TD threading dislocation, and WJ width.

The invention claimed is:

1. A silicon carbide semiconductor device comprising:
a drift layer of a first conductivity type;
a threading dislocation provided to penetrate the drift layer; and
n electric-field reduction region of a second conductivity type disposed in a position in a surface layer of the drift layer, the position corresponding to the threading dislocation,
wherein the electric-field reduction region is an epitaxial layer comprising a dopant of the second conductivity type whose concentration is homogeneous and whose tail profile is not established, and
wherein the electric-field reduction region is at least partly buried in the position in the surface layer of the drift layer, the position corresponding to the threading dislocation.

2. The silicon carbide semiconductor device according to claim 1, wherein the following expressions are satisfied on an axis extending from an upper surface of the drift layer including the electric-field reduction region to a lower surface of the drift layer, where d [m] denotes a thickness of the electric-field reduction region, where $\varepsilon_\gamma$ [F/m] denotes a relative permittivity of silicon carbide, where $\varepsilon_o$ [F/m] denotes a vacuum permittivity of silicon carbide, where e [C] denotes the amount of an electron charge, where x [m] denotes a coordinate in a direction from the upper surface of the drift layer serving as an origin point toward the lower surface of the drift layer, where $W_1$ [m] denotes a distance from the upper surface of the drift layer serving as an origin point to a first end of a depletion layer produced during an OFF state of the silicon carbide semiconductor device, where $W_2$ [m] denotes a distance from the upper surface of the drift layer serving as an origin point to a second end of the depletion layer produced in the OFF state of the silicon carbide semiconductor device, the first end being an end of the depletion layer on a lower-surface side of the drift layer, the second end being an end of the depletion layer on a upper-surface side of the drift layer, where $N_D(x)$ [m$^{-3}$] denotes a concentration of an impurity of the first conductivity type in the coordinate x, where $N_A(x)$ [m$^{-3}$] denotes a concentration of an impurity of the second conductivity type in the coordinate x, where $E(x)$ [V/m] denotes electric-field strength in the coordinate x, where V [V] denotes a potential difference between a drain and source of the silicon carbide semiconductor device during the OFF state:

[Numeral 1]

$$1.0 \times 10^{-7} < W_2 < d, \quad (1)$$

[Numeral 2]

$$E(x) = -\frac{e}{\varepsilon_\gamma \varepsilon_o} \int_{W_1}^{x} \{N_D(x) - N_A(x)\}dx \ (W_2 \le x \le W_1), \quad (2)$$

[Numeral 3]

$$E(x = W_2) = E(x = W_1) = 0, \text{ and} \quad (3)$$

[Numeral 4]

$$V = \int_{W_2}^{W_1} E(x)dx. \quad (4)$$

3. The silicon carbide semiconductor device according to claim 1, further comprising:
an insulating film disposed in a position on an upper surface of the drift layer, the position corresponding to the threading dislocation; and
an electrode disposed in a position on an upper surface of the insulating film, the position corresponding to the threading dislocation.

4. The silicon carbide semiconductor device according to claim 3, further comprising:
a plurality of well regions of a second conductivity type disposed in the surface layer of the drift layer;
a JFET region provided to be sandwiched between the plurality of well regions; and
a source region of the first conductivity type disposed in a position in a surface layer of each well region, the position being spaced from the JFET region by the well region,
wherein the electrode is disposed in a position on the upper surface of the insulating film, the position corresponding to the JFET region, and in another position on the upper surface of the insulating film, the other position corresponding to a portion between the source region and the drift layer.

5. The silicon carbide semiconductor device according to claim 4, wherein the electric-field reduction region is disposed in a surface layer of the JFET region.

6. The silicon carbide semiconductor device according to claim 4, wherein the electric-field reduction region is disposed to be in contact with at least one of the plurality of well regions.

7. The silicon carbide semiconductor device according to claim 2, wherein the concentration of the dopant of the second conductivity type in the electric-field reduction region is $1\times10^{15}$ cm$^{-3}$ or more and $1\times10^{20}$ cm$^{-3}$ or less.

8. A method for manufacturing a silicon carbide semiconductor device, comprising:
preparing a silicon carbide layer comprising a threading dislocation provided to extend from a lower surface of the silicon carbide layer to an upper surface of the silicon carbide layer;
forming a pit in a position in the upper surface of the silicon carbide layer, the position corresponding to the threading dislocation;
after forming the pit, epitaxially growing a silicon carbide epitaxial layer of a second conductivity type on the upper surface of the silicon carbide layer; and
partly removing the silicon carbide epitaxial layer while leaving a portion buried in the pit unremoved, to form an electric-field reduction region.

9. The method for manufacturing a silicon carbide semiconductor device according to claim 8, wherein forming the pit comprises forming a thermal oxide film on the upper surface of the silicon carbide layer, and further removing the thermal oxide film through wet etching.

10. The method for manufacturing a silicon carbide semiconductor device according to claim 8, wherein forming the pit comprises dry-etching the upper surface of the silicon carbide layer through annealing within a hydrogen gas.

11. The method for manufacturing a silicon carbide semiconductor device according to claim 8, wherein forming the electric-field reduction region while leaving the portion buried in the pit unremoved comprises forming an etching mask all over an upper surface of the silicon carbide epitaxial layer, and further dry-etching the upper surface of the silicon carbide epitaxial layer via the etching mask.

12. The method for manufacturing a silicon carbide semiconductor device according to claim 11, wherein forming the electric-field reduction region while leaving the portion buried in the pit unremoved comprises depositing a silicon oxide film all over the upper surface of the silicon carbide epitaxial layer to form an etching mask, and further dry-etching the upper surface of the silicon carbide epitaxial layer via the etching mask.

13. The method for manufacturing a silicon carbide semiconductor device according to claim 8, wherein forming the electric-field reduction region comprises partly removing the silicon carbide epitaxial layer through polishing while leaving the portion buried in the pit unremoved.

* * * * *